(12) United States Patent
Ashburn, Jr. et al.

(10) Patent No.: US 8,502,719 B2
(45) Date of Patent: Aug. 6, 2013

(54) CONTINUOUS-TIME OVERSAMPLED CONVERTER HAVING PASSIVE FILTER

(75) Inventors: Michael A. Ashburn, Jr., Groton, MA (US); Jeffrey Carl Gealow, Andover, MA (US)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 13/354,333

(22) Filed: Jan. 20, 2012

(65) Prior Publication Data

US 2013/0021183 A1    Jan. 24, 2013

Related U.S. Application Data

(60) Provisional application No. 61/435,012, filed on Jan. 21, 2011.

(51) Int. Cl.
*H03M 3/00* (2006.01)

(52) U.S. Cl.
USPC .......................................... 341/143; 341/155

(58) Field of Classification Search
USPC ....................................................... 341/143
See application file for complete search history.

(56) References Cited

U.S. PATENT DOCUMENTS

| | | | |
|---|---|---|---|
| 6,583,662 B1 | 6/2003 | Lim | |
| 6,967,606 B2* | 11/2005 | Wiesbauer et al. | 341/143 |
| 7,375,666 B2* | 5/2008 | Melanson | 341/143 |
| 7,671,774 B2 | 3/2010 | Braswell | |
| 7,688,236 B2* | 3/2010 | Di Giandomenico et al. | 341/120 |
| 7,893,855 B2* | 2/2011 | Huang | 341/143 |
| 2006/0017595 A1 | 1/2006 | Van Veldhoven | |
| 2007/0096808 A1 | 5/2007 | Sutardja | |
| 2008/0062022 A1 | 3/2008 | Melanson | |
| 2009/0009375 A1 | 1/2009 | Mathe | |

OTHER PUBLICATIONS

Yan, A Continuous-Time Sigma-Delta Modulator with 88dB Dynamic Range and 1.1 MHz Signal Bandwidth, ISSCC 2003, Session 3, Oversampled A/D Converters, Paper 3.5.
Cherry, Excess Loop Delay in Continuous-Time Delta-Sigma Modulators, IEEE Transactions on Circuits and Systems-II: Analog and Digital Signal Processing, pp. 376-389, vol. 46, No. 4, Apr. 1999.
Paton, A 70-mW 300-MHz CMOS Continuous-Time Sigma-Delta ADC With 15-MHz Bandwidth and 11 Bits of Resolution, IEEE Journal of Solid-State Circuits, pp. 1056-1063, vol. 39, No. 7, Jul. 2004.
"International Search Report" mailed on Mar. 26, 2012 for International application No. PCT/US12/21934, International filing date: Jan. 20, 2012.

* cited by examiner

*Primary Examiner* — Khai M Nguyen
(74) *Attorney, Agent, or Firm* — Winston Hsu; Scott Margo

(57) ABSTRACT

A continuous-time sigma-delta analog-to-digital converter includes a first integrator stage to integrate a difference between a first differential signal derived from a differential analog input signal and a second differential signal derived from a quantized output signal, a quantizer and a low pass filter. The first integrator stage has a differential operational amplifier, first, second, third, and fourth input resistors, and a first pair of integrating capacitors. The differential analog input signal is received at first and second input nodes of the converter. The first and third input resistors are coupled in series between the first input node and a first input of the operational amplifier. The second and fourth input resistors are coupled in series between the second input node and a second input of the operational amplifier. The first and second input resistors are coupled to the third and fourth input resistors, respectively.

21 Claims, 17 Drawing Sheets

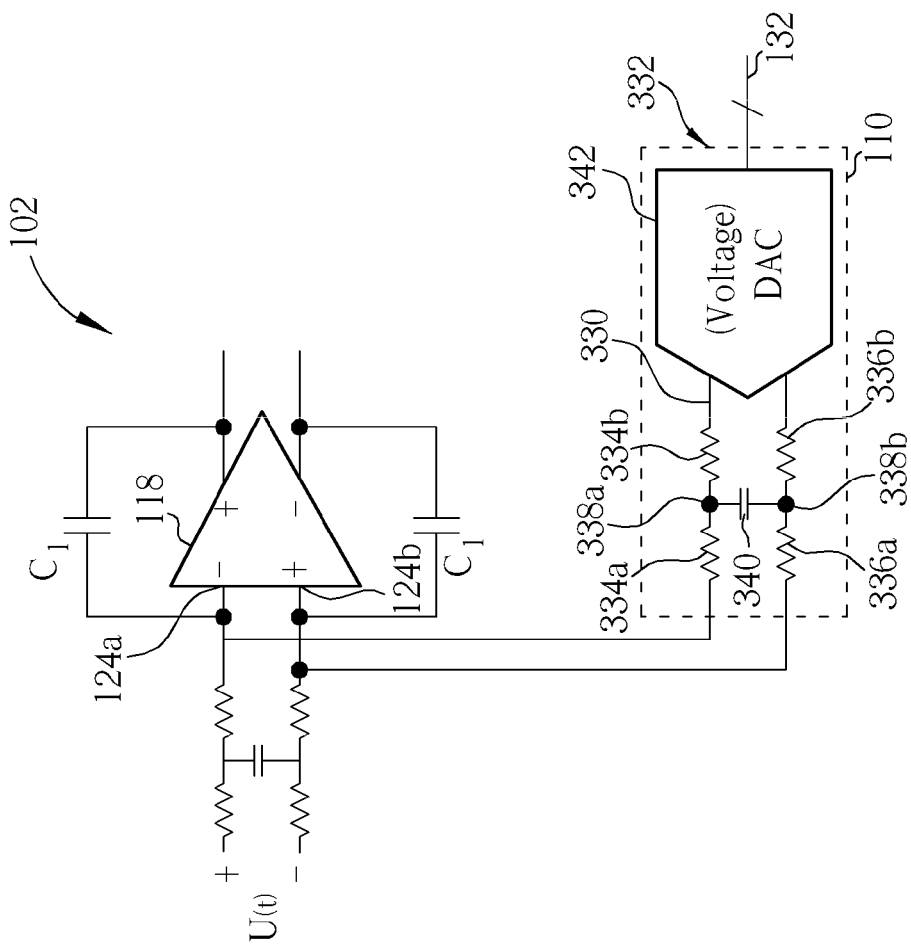
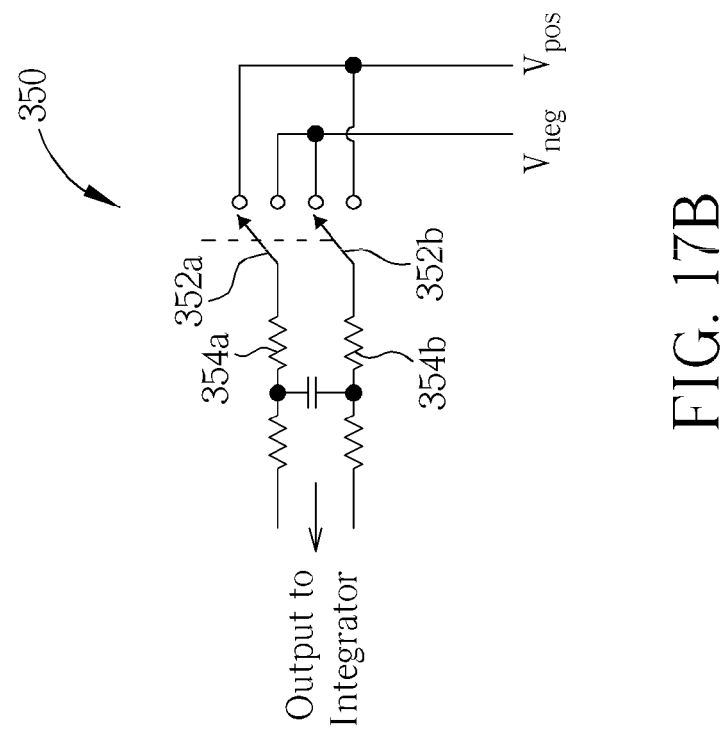
FIG. 17B
FIG. 17A

CONTINUOUS-TIME OVERSAMPLED CONVERTER HAVING PASSIVE FILTER

CROSS REFERENCE TO RELATED APPLICATIONS

This application claims the benefit of U.S. provisional application 61/435,012, filed on Jan. 21, 2011, which is incorporated by reference in its entirety.

BACKGROUND

The present disclosure relates generally to electronics, and more specifically to continuous-time oversampled converters.

Continuous-time analog-to-digital converters (CT ADCs) are distinguished from their discrete-time counterparts (DT ADCs) in that sampling is not used in their front-end circuitry. Rather, in the case of a continuous-time ADC, some form of filtering or analog processing is employed prior to sampling (or storing) the input waveform as part of the eventual digitization. This continuous-time approach has several advantages as compared to using a discrete-time converter. For example, two benefits of using continuous-time analog-to-digital converters are reduced sensitivity to coupled noise and the potential for lower power implementations. In the case of the continuous-time analog-to-digital converter, another benefit is the removal of the requirement for an anti-aliasing filter. Along with its advantages, the continuous-time converter has the disadvantage of increased sensitivity to clock uncertainty in the form of jitter. As a result, the continuous-time implementation requires increased performance requirements for the clock circuitry.

With the ongoing and significant growth in the area of portable electronics, low power is a major if not dominant concern in many consumer electronics as a way to extend battery life, and thereby increase usage time (e.g., talk or playback time). Additionally, as high volume consumer markets continue to drive increasing levels of integration on a single chip, the potential for noise coupling between various blocks has steadily increased the demands for better noise immunity in critical mixed-signal circuitry. Both of these market driven demands have increased the popularity of continuous-time analog-to-digital converters.

SUMMARY

In general, in one aspect, an apparatus includes a continuous-time sigma-delta analog-to-digital converter. The converter includes a first integrator stage to integrate a difference between a first differential signal derived from a differential analog input signal and a second differential signal derived from a quantized output signal. The first integrator stage has a differential operational amplifier, a first input resistor, a second input resistor, a third input resistor, a fourth input resistor, and a first pair of integrating capacitors. The differential analog input signal is received at a first input node and a second input node of the converter. The first and third input resistors are coupled in series between the first input node and a first input of the operational amplifier. The second and fourth input resistors are coupled in series between the second input node and a second input of the operational amplifier. The first input resistor is coupled to the third input resistor at a third node, and the second input resistor is coupled to the fourth input resistor at a fourth node. The converter includes a quantizer to quantize a third signal derived at least in part from an output of the first integrator stage to generate the quantized output signal. The converter includes a low pass filter to reduce high frequency components of the differential analog input signal provided to the first and second inputs of the operational amplifier. The low pass filter has a cutoff frequency selected to reduce voltage variations at the first and second inputs of the operational amplifier. The low pass filter includes the first, second, third, and fourth input resistors and a filter capacitor coupled between the third and fourth nodes.

Implementations of the apparatus may include one or more of the following features. The filter capacitor provides a low impedance path for high frequency components in the differential input signal.

In general, in another aspect, an apparatus includes a continuous-time sigma-delta analog-to-digital converter. The converter includes a first integrator stage to integrate a difference between a first differential signal derived from a differential analog input signal and a second differential signal derived from a quantized output signal. The first integrator stage has a differential operational amplifier, a first input resistor, a second input resistor, and a first pair of integrating capacitors. The differential analog input signal is received at a first input node and a second input node of the converter. The first input resistor is connected in series between the first input node and a first input of the operational amplifier. The second input resistor is connected in series between the second input node and a second input of the operational amplifier. The converter includes a quantizer to quantize a third signal derived at least in part from an output of the first integrator stage to generate the quantized output signal. The converter includes a high pass filter to remove DC components of the differential analog input signal provided to the first and second inputs of the operational amplifier. The high pass filter includes the first and second input resistors, a first filter capacitor coupled in series between the first input resistor and the first input node, and a second filter capacitor coupled in series between the second input resistor and the second input node.

Implementations of the apparatus may include one or more of the following features. The first and second capacitors block low frequency components in the first and second input signals from passing to the differential amplifier.

In general, in another aspect, an apparatus includes a continuous-time sigma-delta analog-to-digital converter. The converter includes a first integrator stage to integrate a difference between a first signal derived from a differential analog input signal and a second differential signal derived from a quantized output signal. The first integrator stage has a differential operational amplifier, a first input resistor, a second input resistor, a third input resistor, a fourth input resistor, and a first pair of integrating capacitors. The differential analog input signal is received at a first input node and a second input node of the converter. The first and third input resistors are connected in series between the first input node and a first input of the operational amplifier. The second and fourth input resistors are connected in series between the second input node and a second input of the operational amplifier. The first input resistor is connected to the third input resistor at a third node, and the second input resistor is connected to the fourth input resistor at a fourth node. The converter includes a quantizer to quantize a third signal derived at least in part from an output of the first integrator stage to generate the quantized output signal. The converter includes a band pass filter to reduce frequency components of the differential analog input signal outside of a pass band provided to the first and second inputs of the operational amplifier. The band pass filter has an upper cutoff frequency selected to reduce voltage variations at the first and second inputs of the operational amplifier. The band pass filter includes the first, second, third, and fourth input resistors, a first filter capacitor coupled between the third and fourth nodes, a second filter capacitor coupled in series between the third input resistor and the first input node, and a third filter capacitor coupled in series between the fourth input resistor and the second input node.

In general, in another aspect, an apparatus includes a continuous-time third order sigma-delta analog-to-digital converter. The converter includes an input terminal to receive an analog input signal; a first integrator stage to integrate a difference between a first signal derived from the analog input signal and a second signal derived from a quantized output signal; a second integrator stage to integrate a third signal derived at least in part from an output of the first integrator stage; a third integrator stage to integrate a sum of a fourth signal derived from a feed-forward signal and a fifth signal derived at least in part from an output of the second integrator stage, the third integrator stage including an amplifier; and a feed-forward path to provide a signal path for the feed-forward signal from the input terminal to the third integrator stage. The feed-forward path includes a filter to reduce high frequency components of the feed-forward signal provided to the third integrator stage, the filter having a cutoff frequency selected to reduce voltage variations at an input of the amplifier of the third integrator stage. The converter includes a quantizer to quantize a sixth signal derived at least in part from an output of the third integrator stage to generate the quantized output signal.

Implementations of the apparatus may include one or more of the following features. In some implementations, the filter includes a low pass filter. The input terminal includes a differential input terminal having a first input node and a second input node, and the amplifier of the third integrator stage includes a differential amplifier. The low pass filter includes a first resistor, a second resistor, a third resistor, a fourth resistor, and a filter capacitor. The first and third resistors are coupled in series between the first input node and a first input of the differential amplifier. The second and fourth resistors are coupled in series between the second input node and a second input of the differential amplifier. The first resistor is coupled to the third resistor at a third node, the second resistor is coupled to the fourth resistor at a fourth node, and the filter capacitor is coupled between the third and fourth nodes.

In some implementations, the filter includes a band pass filter. The band pass filter reduces low frequency components of the feed-forward signal provided to the third integrator stage. The band pass filter includes a first resistor, a second resistor, a third resistor, a fourth resistor, a first filter capacitor, a second filter capacitor, and a third filter capacitor. The first and third resistors are coupled in series between the first input node and a first input of the differential amplifier. The second and fourth resistors are coupled in series between the second input node and a second input of the differential amplifier. The first resistor is coupled to the third resistor at a third node, and the second resistor is coupled to the fourth resistor at a fourth node. The first filter capacitor is coupled between the third and fourth nodes, the second filter capacitor is coupled in series between the third resistor and the first input node, and the third filter capacitor is coupled in series between the fourth resistor and the second input node.

In some implementations, the filter includes a high pass filter to reduce low frequency components of the feed-forward signal provided to the third integrator stage. The high pass filter includes a first resistor, a second resistor, a first filter capacitor, and a second filter capacitor. The first resistor and the first filter capacitor are coupled in series between the first input node and a first input of the differential amplifier, and the second resistor and the second filter capacitor are coupled in series between the second input node and a second input of the differential amplifier. The amplifier in the third integrator stage includes a transimpedance amplifier that receives a current input and provides a voltage output.

In general, in another aspect, an apparatus includes a continuous-time third order sigma-delta analog-to-digital converter. The converter includes a first integrator stage to integrate a difference between a first signal derived from an analog input signal and a second signal derived from a quantized output signal; a second integrator stage to integrate a sum of a third signal derived from an output of the first integrator stage and a fourth signal derived from a feed-back signal, the second integrator stage comprising an amplifier; a third integrator stage to integrate a fifth signal derived from an output of the second integrator stage; and a feed-back path to provide a signal path for the feed-back signal from an output of the third integrator stage to an input of the second integrator stage. The feed-back path includes a filter to reduce selected frequency components of the feed-back signal provided to the second integrator stage, the filter having a cutoff frequency selected to reduce voltage variations at an input of the amplifier of the second integrator stage. The converter includes a quantizer to quantize a sixth signal derived at least in part from the output of the third integrator stage to generate the quantized output signal.

Implementations of the apparatus may include one or more of the following features. In some implementations, the filter includes a low pass filter. The input signal includes a differential input signal, the amplifier of the second integrator stage includes a differential amplifier, and the amplifier of the third integrator stage includes a differential amplifier. The low pass filter includes a first resistor, a second resistor, a third resistor, a fourth resistor, and a filter capacitor. The first and third resistors are coupled in series between a first input of the amplifier of the second integrator stage and a first output of the amplifier of the third integrator stage. The second and fourth resistors are coupled in series between a second input of the amplifier of the second integrator stage and a second output of the amplifier of the third integrator stage. The first resistor is coupled to the third resistor at a first node, the second resistor is coupled to the fourth resistor at a second node, and the filter capacitor is coupled between the first and second nodes. The filter includes a band pass filter that reduces low frequency components of the feedback signal provided to the second integrator stage. The input signal includes a differential input signal, the amplifier of the second integrator stage includes a differential amplifier, and the amplifier of the third integrator stage includes a differential amplifier. The band pass filter includes a first resistor, a second resistor, a third resistor, a fourth resistor, a first filter capacitor, a second filter capacitor, and a third filter capacitor. The first and third resistors are coupled in series between a first input of the differential amplifier of the second integrator stage and a first output of the differential amplifier of the third integrator stage. The second and fourth resistors are coupled in series between a second input of the differential amplifier of the second integrator stage and a second output of the differential amplifier of the third integrator stage. The first resistor is coupled to the third resistor at a first node, and the second resistor is coupled to the fourth resistor at a second node. The first filter capacitor is coupled between the first and second nodes, the second filter capacitor is coupled in series between the third resistor and a first input of the differential amplifier of the second integrator stage, and the third filter capacitor is coupled in series between the fourth resistor and a second input of the differential amplifier of the second integrator stage.

In some implementations, the filter includes a high pass filter. The input signal includes a differential input signal, the amplifier of the second integrator stage includes a differential amplifier, and the amplifier of the third integrator stage includes a differential amplifier. The high pass filter includes a first resistor, a second resistor, a first filter capacitor, and a second filter capacitor. The first resistor and the first filter capacitor are coupled in series between a first output of the differential amplifier of the third integrator stage and a first input of the differential amplifier of the second integrator stage. The second resistor and the second filter capacitor are coupled in series between a second output of the differential amplifier of the third integrator stage and a second input of the differential amplifier of the second integrator stage.

In general, in another aspect, an apparatus includes a continuous-time sigma-delta analog-to-digital converter. The converter includes a first integrator stage to integrate a difference between a first signal derived from the analog input signal and a second signal derived from a quantized output signal, the first integrator stage comprising an amplifier; a quantizer to quantize a third signal derived at least in part from an output of the first integrator stage to generate the quantized output signal; and a resistor digital-to-analog converter to convert the quantized output signal to the second signal. The resistor digital-to-analog converter includes switches and resistors. At least one capacitor is used in combination with the resistors to form a low-pass filter to reduce high frequency components in the second signal. The low-pass filter has a cutoff frequency selected to reduce voltage variations at an input of the amplifier of the first integrator stage.

BRIEF DESCRIPTION OF THE DRAWINGS

FIGS. 17A and 17B are diagrams of example implementations of a resistor-DAC having a low-pass characteristic.

DETAILED DESCRIPTION

Figure 1:
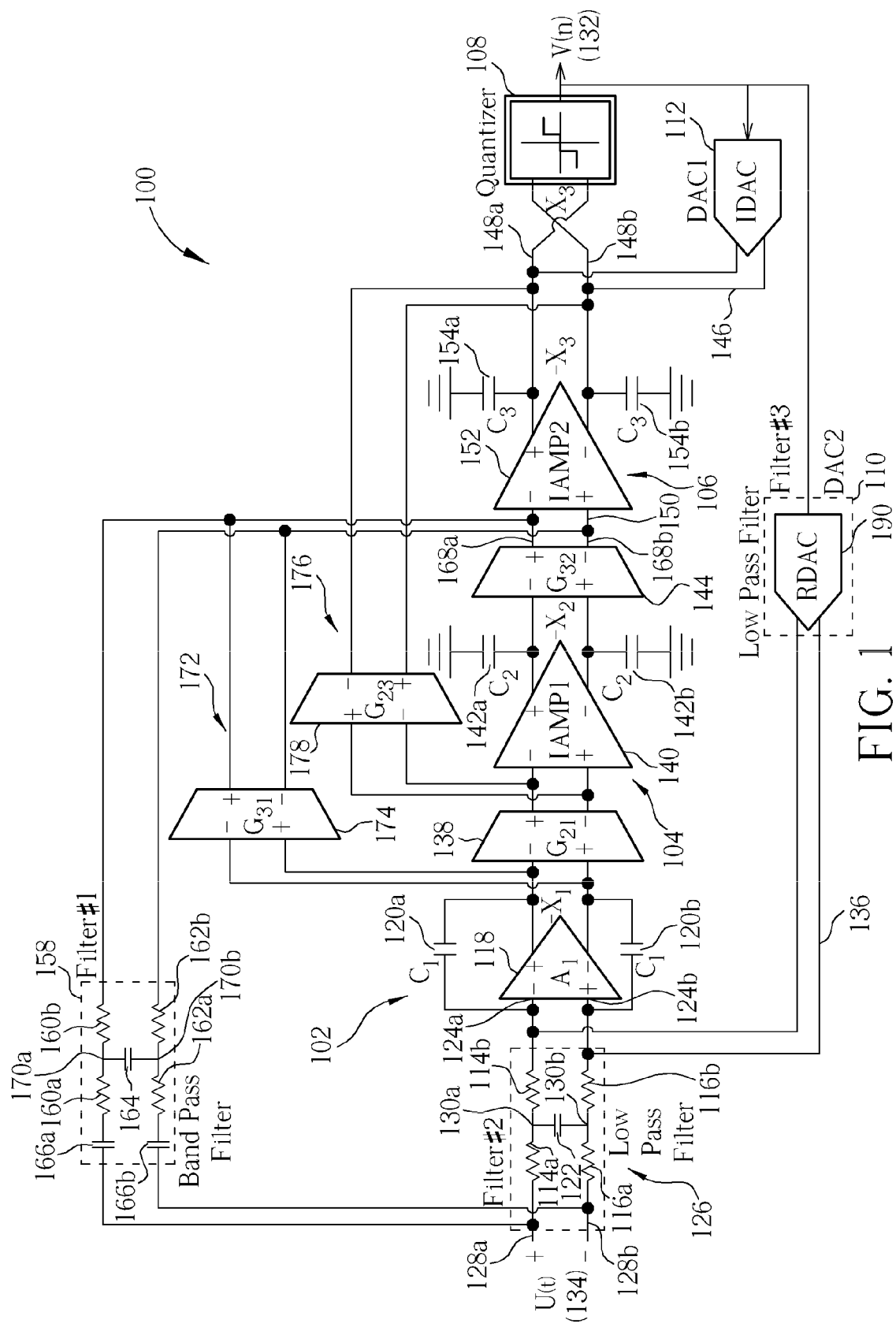
FIG. 1 is a diagram of an example third order continuous-time sigma-delta analog-to-digital converter.

Referring to FIG. 1, in some implementations, a third order continuous-time sigma-delta analog-to-digital converter (ADC) 100 includes three integrator stages 102, 104, and 106, a quantizer 108, an outer feedback digital-to-analog converter (DAC) 110 (DAC2) and an inner feedback DAC 112 (DAC1). The first integrator stage 102 includes a voltage amplifier ($A_1$) 118, input resistors 114a, 114b, 116a, 116b, and integrating capacitors (C1) 120a, 120b. The first integrator stage 102 receives a differential input signal U(t) 134 through a low pass filter 126 formed by the input resistors 114a, 114b, 116a, 116b, and a capacitor 122. The low pass filter 126 reduces high frequency components of the input current, derived from input signal U(t) and provided to inputs 124a and 124b of the voltage amplifier 118. The low pass filter 126 has a cutoff frequency selected to reduce current variations through resistors 114b and 116b. Removing the high frequency components of the input signal U(t) results in lowering the signal frequencies that need to be processed by some of the amplifier stages in the ADC 100.

In this example, the differential input signal U(t) 134 is received at input nodes 128a and 128b. The input resistors 114a and 114b are connected in series between the input node 128a and the input 124a of the voltage amplifier 118. The input resistors 116a and 116b are connected in series between the input node 128b and the input 124b of the voltage amplifier 118. The input resistor 114a is coupled to the input resistor 114b at a node 130a, and the input resistor 116a is coupled to the input resistor 116b at a node 130b. The filter capacitor 122 is coupled between the nodes 130a and 130b.

The voltage amplifier 118, the integrating capacitors 120a, 120b, and the input resistors 114a, 114b, 116a, 116b form an active RC integrator. The outer feedback DAC 110 converts a digital output V(n) 132 (generated by the quantizer 108) to a differential analog current feedback signal 136 that is provided to the inputs 124a, 124b of the voltage amplifier 118. The analog current feedback signal 136 is subtracted from the analog input current U(t) 134 and the result is integrated by the first integrator stage 102.

The output of the first integrator stage 102 is provided to the second integrator stage 104, which includes a transconductance (Gm) stage 138, a current buffer 140, and integrating capacitors 142a, 142b. The output of the second integrator stage 104 is provided to the third integrator stage 106.

The third integrator stage 106 includes a transconductance (Gm) stage ($G_{32}$) 144, a current buffer (IAMP2) 152, and integrating capacitors ($C_3$) 154a, 154b. The inner feedback DAC 112 is a current DAC that converts the digital output V(n) 132 to an analog current feedback signal 146 that is provided to outputs 148a, 148b of the third integrator stage 106. Both the analog current feedback signal 146 and an input signal 150 provided to the current buffer 152 are integrated by the integrating capacitors 154a, 154b.

The analog-to-digital converter 100 includes several feed forward and feedback paths. For example, the ADC 100 includes a feed forward path 156 from the input nodes 128a, 128b to inputs 168a, 168b of the current buffer 152. The feed forward path 156 includes a band pass filter 158 that filters out DC components in the input signal U(t) 134 to avoid affecting the common mode voltage at the third integrator stage 106. The band pass filter 158 includes resistors 160a, 160b, 162a, 162b and capacitors 164, 166a, 166b. The resistors 160a and 160b are connected in series between the input node 128a and the input 168a of the current buffer 152. The resistors 162a and 162b are connected in series between the input node 128b and the input 168b of the current buffer 152. The resistor 160a is coupled to the resistor 160b at a node 170a, and the resistor 162a is coupled to the resistor 162b at a node 170b. The capacitor 164 is coupled between the nodes 170a and 170b. The capacitor 166a is connected in series between the input node 128*a* and the resistor 160*a*, and the capacitor 166*b* is connected in series between the input node 128*b* and the resistor 162*a*.

The series capacitors 166*a* and 166*b* block direct current components and limit low-frequency signals in the feed forward path 156. The capacitor 164 between the resistors limits the high-frequency signals in the feed forward path 156. The capacitors 166*a* and 166*b* combined with the resistors form a high-pass characteristic, and the addition of the capacitor 164 crossing between the resistors forms a low-pass characteristic. The net result is a band-pass filter that attenuates low frequency and high frequency signals in the feed forward path 156.

The value of using the band-pass filter 158 in the outer feed-forward path 156 is the reduced performance requirements of the current buffer 152 in the third integrator stage 106. The high-pass behavior (from the series capacitors 166*a*, 166*b*) isolates the common-mode voltage at the inputs 128*a*, 128*b* of the ADC 100 from the common-mode voltage at the inputs 168*a*, 168*b* of the current buffer 152 in the third integrator stage 106. Therefore, no DC currents will flow from the inputs 128*a*, 128*b* to the current buffer 152, simplifying the design of the current buffer 152. The low-pass behavior of the filter 158 limits the maximum input frequency range that the current buffer 152 receives. With a lower input frequency range, the speed requirements of the current buffer 152 can be reduced, thereby reducing power consumption.

Figure 11:
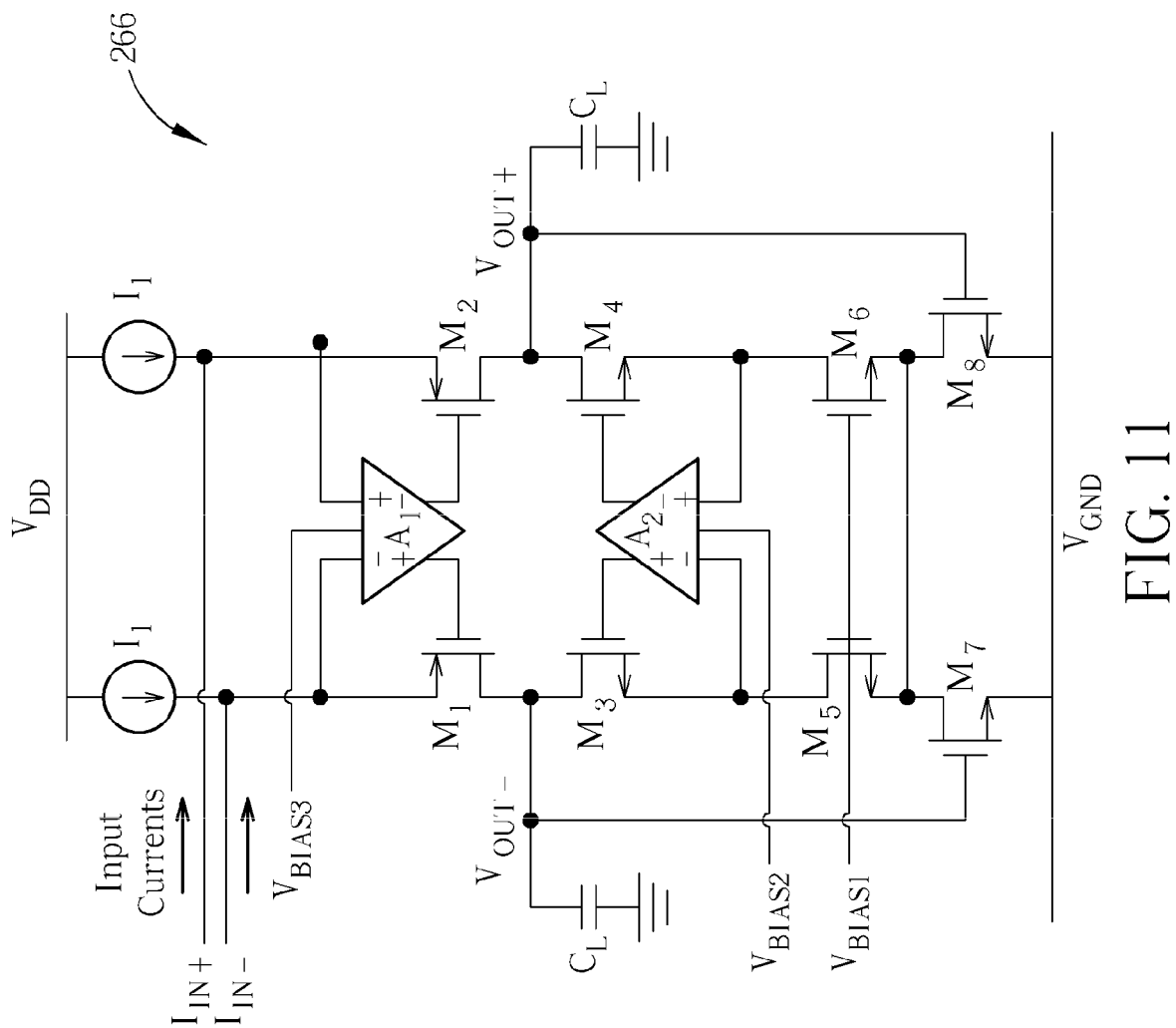
FIG. 11 is a diagram of an example current buffer.

For example, the current buffer 152 in FIG. 1 can be implemented using a current buffer 266 shown in FIG. 11. Using the band-pass filter 158 in the converter 100 reduces the bandwidth requirement for the amplifier A1 in the current buffer 266.

A feed forward path 172 includes a transconductance stage 174 ($G_{31}$) that converts the output of the first integrator stage 102 to a current signal that is provided to the input of the current buffer 152 in the third integrator stage 106. A feedback path 176 has a transconductance stage 178 ($G_{23}$) that converts the output signal of the third integrator stage 106 to a current signal that is provided to the input of the current buffer 140 of the second integrator stage 104.

The oversampled continuous-time ADC 100 can be, e.g., connected in series with a digital signal processor, or be part of a mixed-signal processing chain. The ADC 100 can be part of a system-on-a-chip that includes analog and digital circuitry. The ADC 100 can be included in any electronic device that uses an analog-to-digital converter, such as an audio encoder or video encoder. The ADC 100 is useful in mobile devices, e.g., mobile phones, laptop computers, and tablet computers.

Figure 2:
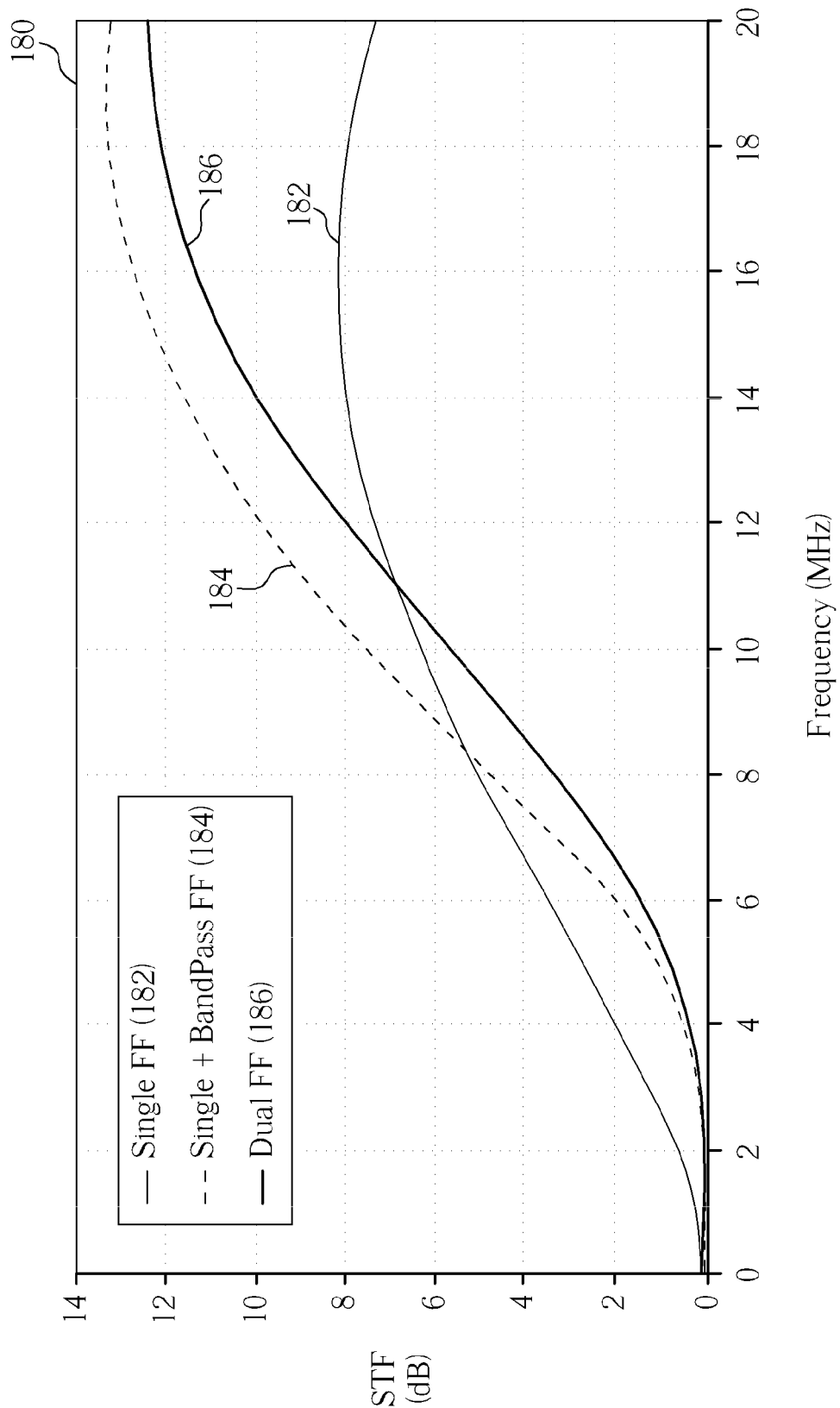
FIG. 2 is a graph of signal transfer functions for various converters.

Referring to FIG. 2, a graph 180 shows signal transfer functions of various analog-to-digital converter configurations. A curve 182 represents the signal transfer function (STF) of an analog-to-digital converter having a single feed forward path. A curve 184 represents the signal transfer function of an analog-to-digital converter having a single feed forward path that includes a band pass filter (similar to the configuration shown in FIG. 1). A curve 186 represents the signal transfer function of an analog-to-digital converter having dual feed forward paths, without using a band pass filter in the feed forward path. A comparison of the curves 184 and 182 indicates that the insertion of the band pass filter causes the signal transfer function peaking to be significantly pushed out to higher frequencies when compared to the single feed forward converter. For example, in the frequency range 0 to 8 MHz, the curve 184 is lower than the curve 182, indicating that the STF peaking of an ADC having a band pass filter in the feed forward path occurs at a higher frequency compared to an ADC using a feed forward path without a band pass filter. A comparison of the curves 184 and 186 indicates that the insertion of the band pass filter results in a slight increase in peaking versus the basic dual-feed forward implementation.

In the low pass filter 126 of the ADC 100, the capacitor 122 is placed between the resistors in order to attenuate higher frequency signal content in the input signal U(t) 134. The benefit here is that the movement at the summing junction (at nodes 124*a*, 124*b*) is reduced because the high frequency components of the input current are reduced. As a result, the performance of the voltage amplifier 118 can be relaxed, thereby saving power. The cutoff frequency of the low-pass filter 126 cannot be too low as this may affect the stability of the closed loop of the converter 100. Adding the filter 126 may slightly change the noise shaping characteristics of the converter 100, however with proper placement of the cutoff frequency, this will have little to no effect on the baseband performance.

The outer feedback DAC2 110 includes a resistor-DAC 190 and filter capacitors. The filter capacitors and the resistors in the resistor-DAC 190 form a low pass filter that has effects similar to that of the low pass filter 126. The passive filters are used to add a low-pass characteristic to the resistor-DAC 190. The low-pass filters reduce the high-frequency content that needs to be processed by the first stage amplifier 118. This reduces the performance requirements of the first integrator stage 102, enabling power to be reduced.

An example of the outer feedback DAC2 110 is shown in FIG. 17A. The outer feedback DAC2 110 includes a DAC 342 and a low pass filter 332 that has a configuration similar to the low pass filter 126. A controlled voltage 330, as defined by the digital input 132 to the DAC 342, is developed across the series resistor network that feeds the summing junction of the first integrator stage 102. The summing junction refers to the inputs 124*a*, 124*b* of the voltage amplifier 118 used to construct the active RC integrator stage 102. The low-pass filter 332 is constructed by placing a filter capacitor across the differential signal paths at the point where series resistors are connected. In this example, the low-pass filter 332 includes resistors 334*a* and 334*b* that are connected in series at a node 338*a*, resistors 336*a* and 336*b* that are connected in series at a node 338*b*, and a filter capacitor 340 connected between the nodes 338*a* and 338*b*. The filter capacitor 340 attenuates high-frequency components of the output current from the DAC 342, thereby reducing the high-frequency input currents seen by the integrator stage 102. This may reduce the performance requirements of the amplifier 118 and enable power savings.

FIG. 17B shows an example implementation for a resistive-DAC 350. In this example, only two output levels are used. Two switches 352*a* and 352*b* are used to select the output state of the DAC 350. In one state, the upper resistor 354*a* is connected to Vpos and the lower resistor 354*b* is connected to Vneg. Defining the upper resistor path as positive, this produces a voltage across the resistors of Vpos-Vneg. When the switches are configured in other possible configuration, Vneg is applied to the top resistor 354*a* and Vpos is applied to the lower resistor 354*b*. The resulting input voltage is then Vneg-Vpos, the negative of the other configuration. This example is that of a 2-state DAC, but the method can be applied to any number of DAC levels as well as different DAC implementations as used to develop a digitally controlled voltage across the resistors in the DAC.

Various modifications can be made to the analog-to-digital converter 100 of FIG. 1. For example, referring to FIG. 3, a third order continuous-time sigma-delta analog-to-digital converter 200 is similar to the ADC 100, except that the low pass filter 126 is replaced with a high-pass filter 202. The ADC 200 includes a first integrator stage 102, which includes a voltage amplifier 118, input resistors 204a, 204b, and integrating capacitors 120a, 120b. The high-pass filter 202 is formed by the input resistors 204a, 204b and capacitors 206a, 206b. The input resistor 204a and the capacitor 206a are connected in series between the input node 128a and the input 124a to the voltage amplifier 118. The input resistor 204b and the capacitor 206b are connected in series between the input node 128b and the input 124b to the voltage amplifier 118.

The high pass filter 202 isolates the common-mode voltage at the inputs 128a, 128b of the ADC 200 from the common-mode voltage at the inputs 124a, 124b of the current buffer 118 in the first integrator stage 102.

Figure 4:
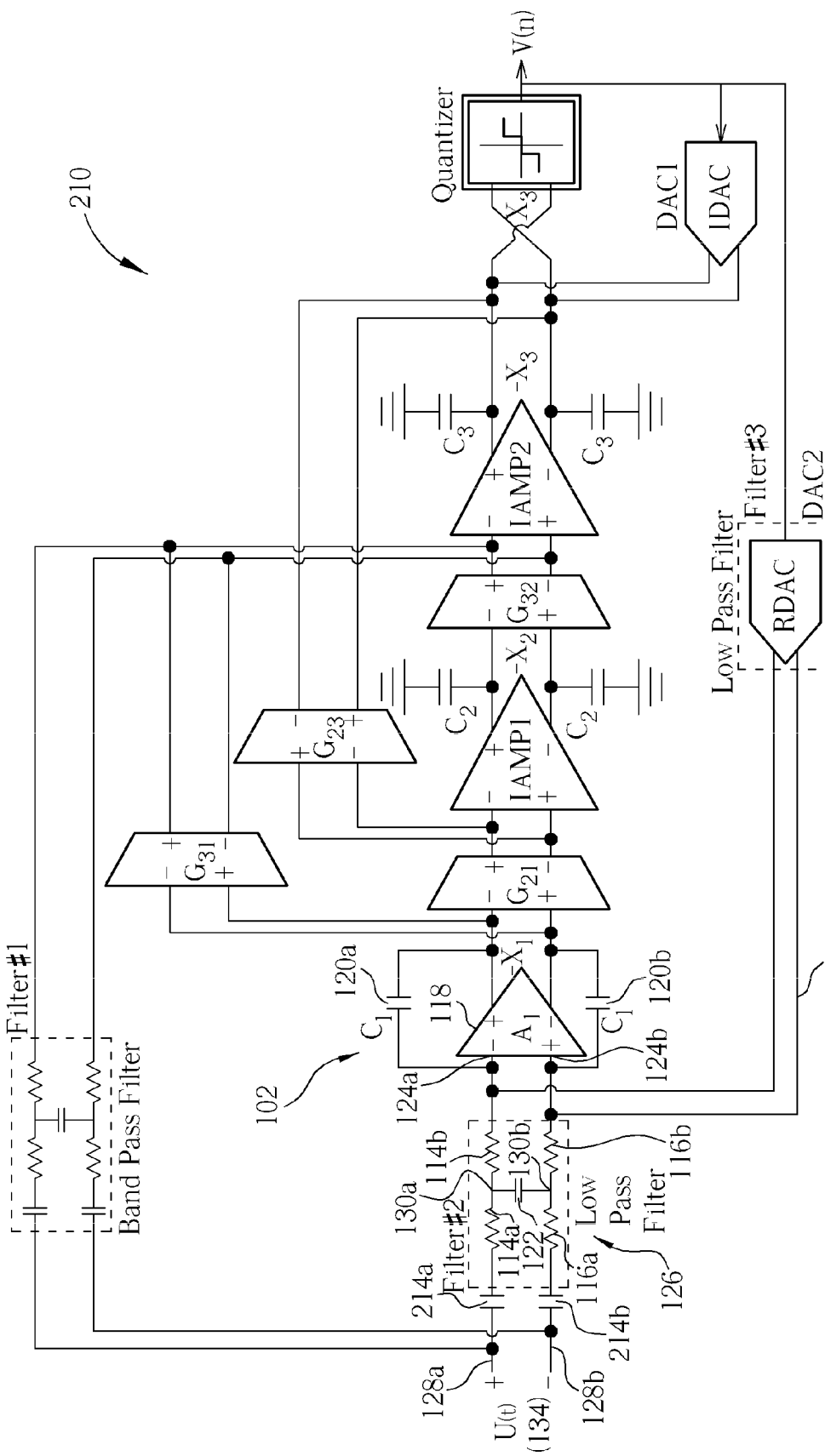

Referring to FIG. 4, a third order continuous-time sigma-delta analog-to-digital converter 210 is similar to the ADC 100, except that the low-pass filter 126 is replaced with a band-pass filter 212. The ADC 210 includes a first integrator stage 102, which includes a voltage amplifier 118, input resistors 114a, 114b, 116a, 116b, and integrating capacitors 120a, 120b. The band-pass filter 212 is formed by the input resistors 114a, 114b, 116a, 116b, and capacitors 122, 214a, 214b. The input resistors 114a and 114b are connected in series between the input node 128a and the input 124a of the voltage amplifier 118. The input resistors 116a and 116b are connected in series between the input node 128b and the input 124b of the voltage amplifier 118. The input resistor 114a is coupled to the input resistor 114b at a node 130a, and the input resistor 116a is coupled to the input resistor 116b at a node 130b. The filter capacitor 122 is coupled between the nodes 130a and 130b. The capacitor 214a is connected in series between the input node 128a and the resistor 114a, and the capacitor 214b is connected in series between the input node 128b and the resistor 116a.

The band-pass filter 212 isolates the common-mode voltage at the inputs 128a, 128b of the ADC 210 from the common-mode voltage at the inputs 124a, 124b of the current buffer 118 in the first integrator stage 102. The band-pass filter 212 attenuates low frequency and high frequency signal components in the input signal U(t) 134 that is sent to the inputs 124a, 124b of the voltage amplifier 118.

Using the band-pass filter 212 has the advantage of reducing performance requirements of the voltage amplifier 118 in the first integrator stage 102. The high-pass behavior (from the series capacitors 214a, 214b) isolates the common-mode voltage at the inputs 128a, 128b of the ADC 210 from the common-mode voltage at the inputs 124a, 124b of the voltage amplifier 118 in the first integrator stage 102. Therefore, no DC currents will flow from the inputs 128a, 128b to the voltage amplifier 118, simplifying the design of the voltage amplifier 118. The band-pass filter 212 limits the maximum input frequency range that the voltage amplifier 118 receives. With a lower input frequency range, the speed requirements of the voltage amplifier 118 can be reduced, thereby reducing power consumption.

Figure 5:
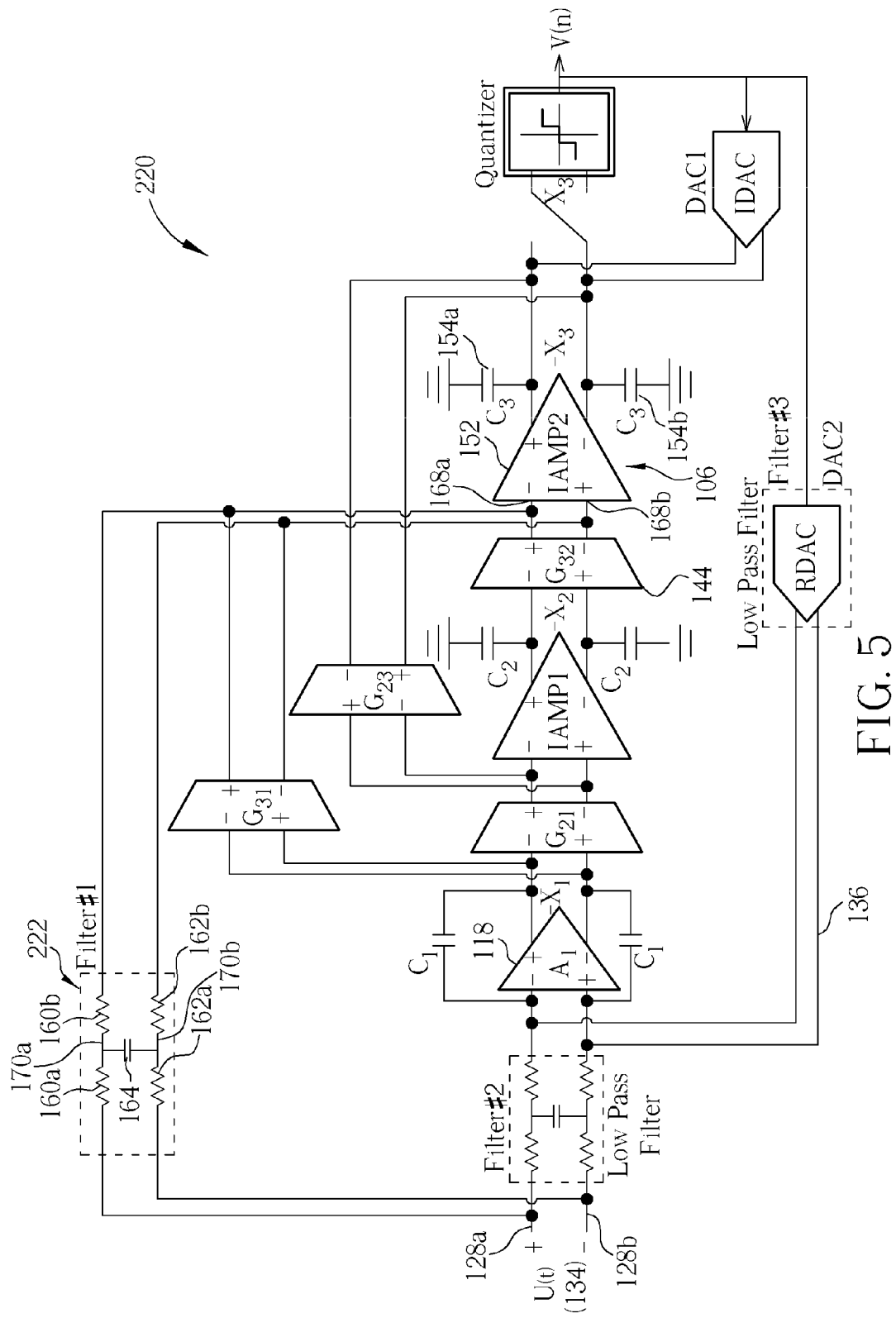

Referring to FIG. 5, a third order continuous-time sigma-delta analog-to-digital converter 220 is similar to the ADC 100, except that the band-pass filter 158 is replaced with a low-pass filter 222. The ADC 220 includes, among other components, a third integrator stage 106, which includes a transconductance (Gm) stage ($G_{32}$) 144, a current buffer (IAMP2) 152, and integrating capacitors ($C_3$) 154a, 154b. The low-pass filter 222 includes resistors 160a, 160b, 162a, 162b and a capacitor 164. The resistors 160a and 160b are connected in series between the input node 128a and the input 168a of the current buffer 152. The resistors 162a and 162b are connected in series between the input node 128b and the input 168b of the current buffer 152. The resistor 160a is coupled to the resistor 160b at a node 170a, and the resistor 162a is coupled to the resistor 162b at a node 170b. The capacitor 164 is coupled between the nodes 170a and 170b.

The low-pass filter 222 reduces high frequency components of the input signal U(t) provided to inputs 168a and 168b of the current buffer 152. The low-pass filter 222 has a cutoff frequency selected to reduce voltage variations at the inputs 168a, 168b of the current buffer 152. Removing the high frequency components of the input signal U(t) results in lowering the signal frequencies that need to be processed by the third integrator stage 106.

Figure 6:
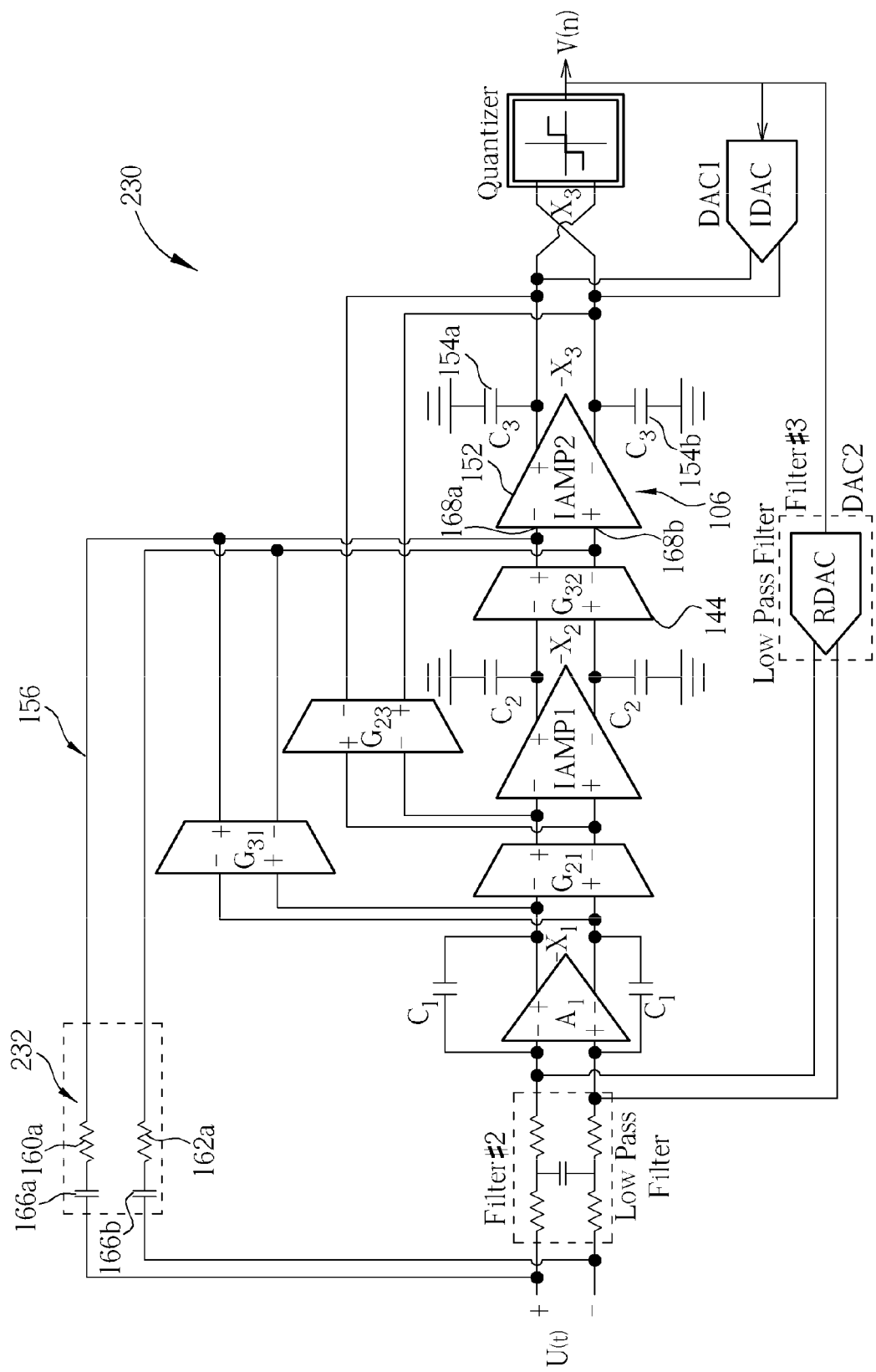

Referring to FIG. 6, a third order continuous-time sigma-delta analog-to-digital converter 230 is similar to the ADC 100, except that the band-pass filter 158 is replaced with a high-pass filter 232. The ADC 230 includes, among other components, a third integrator stage 106, which includes a transconductance (Gm) stage ($G_{32}$) 144, a current buffer (IAMP2) 152, and integrating capacitors ($C_3$) 154a, 154b. The high-pass filter 232 includes resistors 160a, 162a and capacitors 166a, 166b. The resistor 160a and the capacitor 166a are connected in series between the input node 128a and the input 168a of the current buffer 152. The resistor 162a and the capacitor 166b are connected in series between the input node 128b and the input 168b of the current buffer 152.

The high-pass filter 232 filters out DC components in the input signal U(t) 134 to avoid affecting the common mode voltage at the third integrator stage 106. The advantage of using the high-pass filter 232 in the outer feed-forward path 156 is the reduced performance requirements of the current buffer 152 in the third integrator stage 106. The high-pass behavior (from the series capacitors 166a, 166b) isolates the common-mode voltage at the inputs 128a, 128b of the ADC 100 from the common-mode voltage at the inputs 168a, 168b of the current buffer 152 in the third integrator stage 106. Therefore, no DC currents will flow from the inputs 128a, 128b to the current buffer 152, simplifying the design of the current buffer 152.

FIGS. 1 and 3-6 show examples of third order continuous-time sigma-delta analog-to-digital converters. Other types of continuous-time sigma-delta analog-to-digital converters can also use the low-pass, high-pass, or band-pass filters shown in FIGS. 1 and 3-6.

Figure 3:
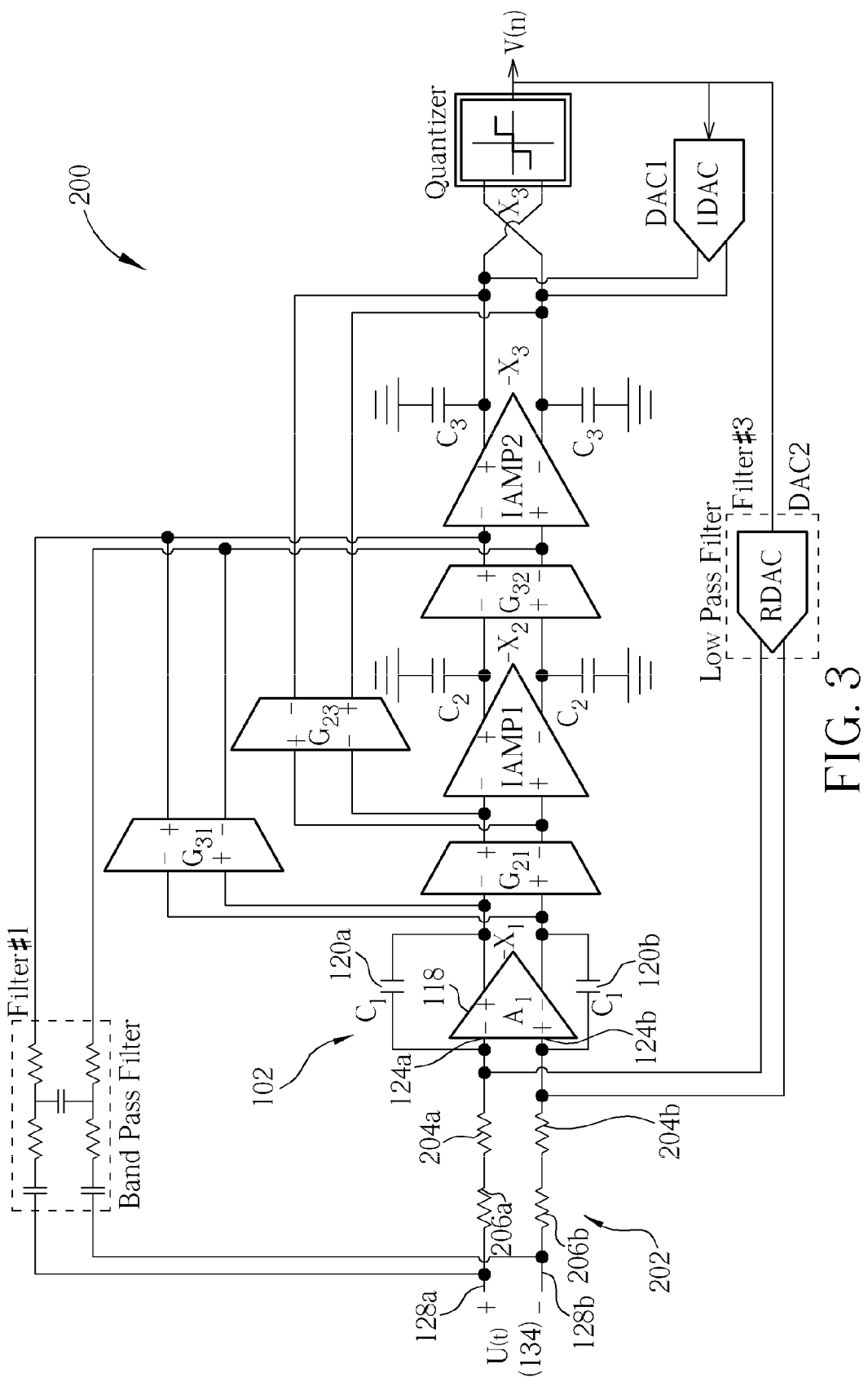
FIGS. 3-6 are diagrams of example third order continuous-time sigma-delta analog-to-digital converters.

For example, a second order continuous-time sigma-delta analog-to-digital converter can use the low-pass filter 122 of FIG. 1, the high-pass filter 202 of FIG. 3, or the band-pass filter 212 of FIG. 4. Each of the low-pass filter 122, high-pass filter 202, and band-pass filter 212 includes the input resistors of the voltage amplifier of the first integrator stage 102. The second order continuous-time sigma-delta analog-to-digital converter can have a feed forward path from the inputs of the ADC (that receive the input signal U(t)) to the inputs of the current buffer in the second integrator stage. The feed forward path can include the band-pass filter 158 of FIG. 1, the low-pass filter 222 of FIG. 5, or the high-pass filter 232 of FIG. 6.

For example, a fourth order continuous-time sigma-delta analog-to-digital converter can use the low-pass filter 122 of FIG. 1, the high-pass filter 202 of FIG. 3, or the band-pass filter 212 of FIG. 4. Each of the low-pass filter 122, high-pass filter 202, and band-pass filter 212 includes the input resistors of the voltage amplifier of the first integrator stage 102. The fourth order continuous-time sigma-delta analog-to-digital converter can have a feed forward path from the inputs of the ADC (that receive the input signal U(t)) to the inputs of the current buffer in the fourth integrator stage. The feed forward path can include the band-pass filter 158 of FIG. 1, the low-pass filter 222 of FIG. 5, or the high-pass filter 232 of FIG. 6.

In general, an N-th order continuous-time sigma-delta analog-to-digital converter can use the low-pass filter 122 of FIG. 1, the high-pass filter 202 of FIG. 3, or the band-pass filter 212 of FIG. 4. Each of the low-pass filter 122, high-pass filter 202, and band-pass filter 212 includes the input resistors of the voltage amplifier of the first integrator stage. The N-th order continuous-time sigma-delta analog-to-digital converter can have a feed forward path from the inputs of the ADC (that receive the input signal U(t)) to the inputs of the current buffer in the N-th integrator stage. The feed forward path can include the band-pass filter 158 of FIG. 1, the low-pass filter 222 of FIG. 5, or the high-pass filter 232 of FIG. 6.

The techniques described above can also be used in so called hybrid sigma-delta analog-to-digital converters. Sigma-delta converters are nominally broken down into different categories based on their specific implementations: discrete-time or continuous-time. If sampling techniques are used at the front end of the converter, the architecture is referred to as discrete-time. In the discrete-time implementation, analog data is processed in fixed (discrete) time intervals. Within each clock period (or half clock period), the analog components completely settle to within a defined error tolerance. This requirement in turn sets the specification for the bandwidth (speed) of critical analog components within the converter.

If the input to the converter is not sampled, but rather processed continuously through one or more analog stages, it is deemed a continuous-time converter. With this implementation, complete settling is not required each clock period (or half clock period) and as a result the speed requirements for the analog blocks within this implementation can be relaxed relative to discrete time converters. This then provides the opportunity for power savings. Some other benefits of the continuous time architecture relative to discrete time converters include enhanced immunity to coupled noise and also removal of the need for an anti-aliasing filter placed in front of the converter. These benefits coupled with the growing demand for portable consumer applications (where power consumption is critical) have made continuous time converters very popular today.

Some sigma-delta converters incorporate both continuous time and discrete time stages. Some sigma-delta converters use sampled and continuous-time approaches within the same stage, such as with a continuous-time input path and a switched-capacitor (discrete time) feedback DAC. Typically, the converter is called continuous-time if the input path is continuous. However, sometimes if discrete time feedback is used and/or later stages are discrete time, the converter may be referred to as "hybrid." The technique of using one or more passive filters to block low frequency and/or high frequency components of the input signal can also be applied to such hybrid sigma-delta analog-to-digital converters. As long as at least one continuous-time circuit is used within the converter, the technique described above can be applied.

For comparison, the following describes examples of sigma-delta analog-to-digital converters that do not use passive filters to block low frequency and/or high frequency components of the input signal.

Sigma-Delta ($\Sigma$-$\Delta$) converters can be used to achieve high signal-to-noise ratios (SNR) using analog components with relatively low resolution that can operate at higher speeds than the signal band of interest. This is accomplished by trading off bandwidth for resolution. Specifically, this technique is referred to as oversampling. As an example, a 13-bit (having a SNR of about 78 dB) ADC with 2 MHz bandwidth can be implemented using a 3-bit quantizer (sub-ADC) and 3-bit DAC, both operating at 250 MHz. This tradeoff can be advantageous in many applications, such as communications, audio, and industrial circuitry.

Figure 7:
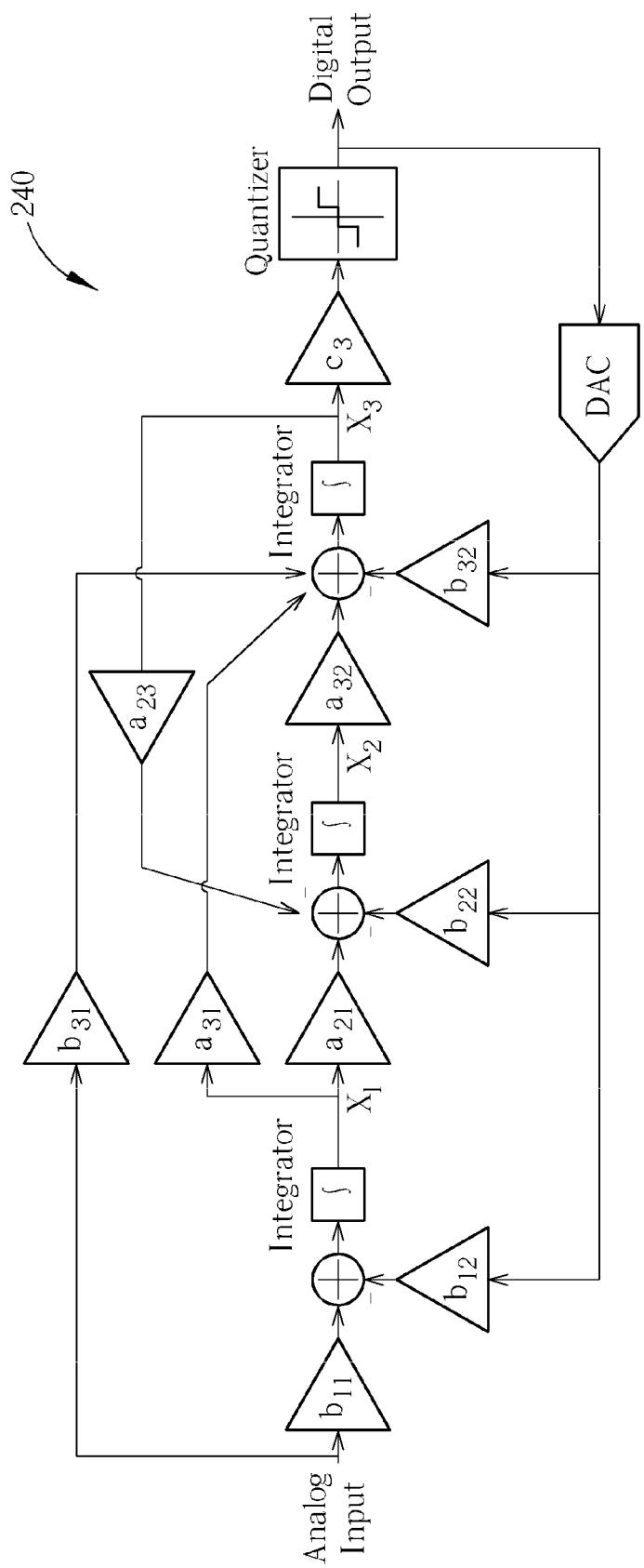
FIG. 7 is a block diagram of an example continuous-time sigma-delta analog-to-digital converter.

FIG. 7 shows a block diagram of an example of a continuous time sigma-delta analog-to-digital converter 240. The feedback digital-to-analog converter (DAC) is subtracted from the scaled input (Analog Input). The result is then integrated (Integrator 1) and passed to a second stage for further processing. Multiple integrator stages, feed-forward, and feedback paths are used to form a desired transfer function for both the input and for the quantization noise that results from the finite resolution of the quantizer and DAC. Different combinations of integrators, feed-forward, feedback, and scaling are used for various design requirements. As a result, different converters may have less or more stages and/or connections than shown in the figure.

Figure 8:
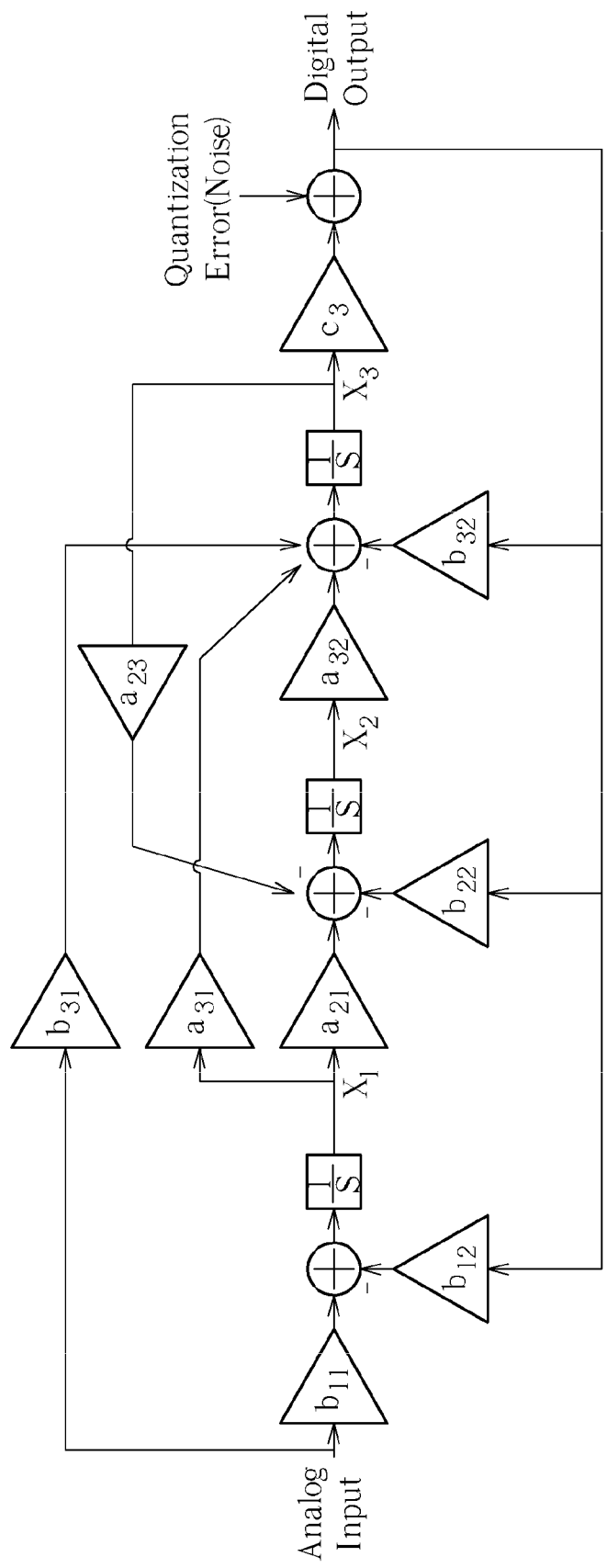
FIG. 8 is a diagram of a linear model for the continuous-time sigma-delta analog-to-digital converter of FIG. 7.
Figure 9:
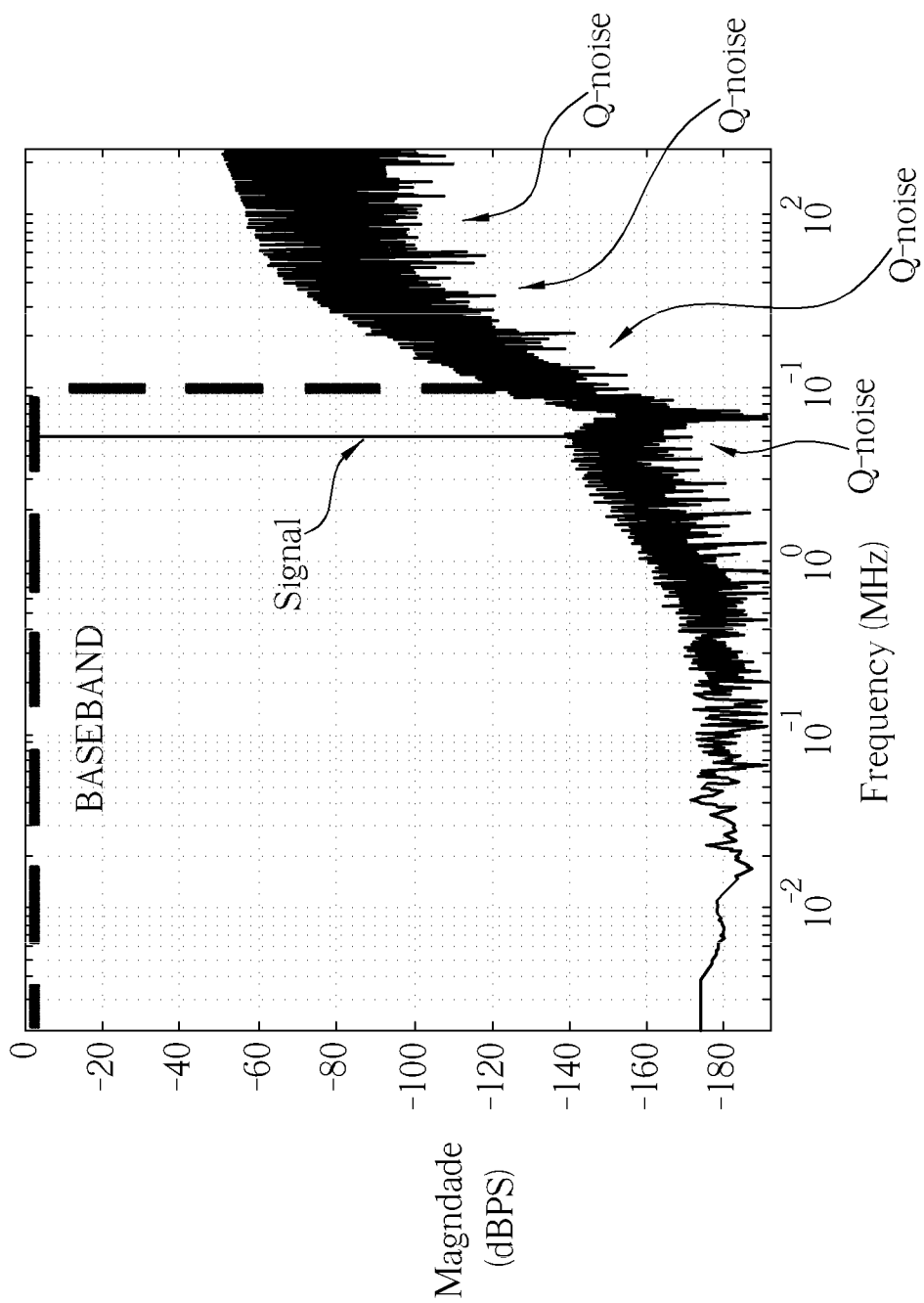
FIG. 9 is a graph of an example output spectrum for the continuous time sigma-delta analog-to-digital converter of FIG. 7.

The linear model for the continuous time converter of FIG. 7 is shown in FIG. 8. Here, the quantizer, used to digitize the analog signal, is replaced by a unity gain stage and a quantization error input. The injection of quantization error models the effect of finite resolution in the quantizer and DAC. This linear model can be solved for the transfer function of the quantization noise to the output of the converter. With proper design, the quantization noise can be "shaped" such that its frequency content is mostly placed outside of the frequency range of interest. An example output spectrum for the converter is shown in FIG. 9. Here, the baseband is at low frequencies (i.e. from DC to whatever bandwidth is required). The quantization noise is therefore shaped with a high-pass characteristic such that it can easily be removed with post-processing using a low-pass filter. Sigma-delta converters can also be implemented for band-pass applications when the frequency range of interest does not extend all the way down to DC.

Figure 10:
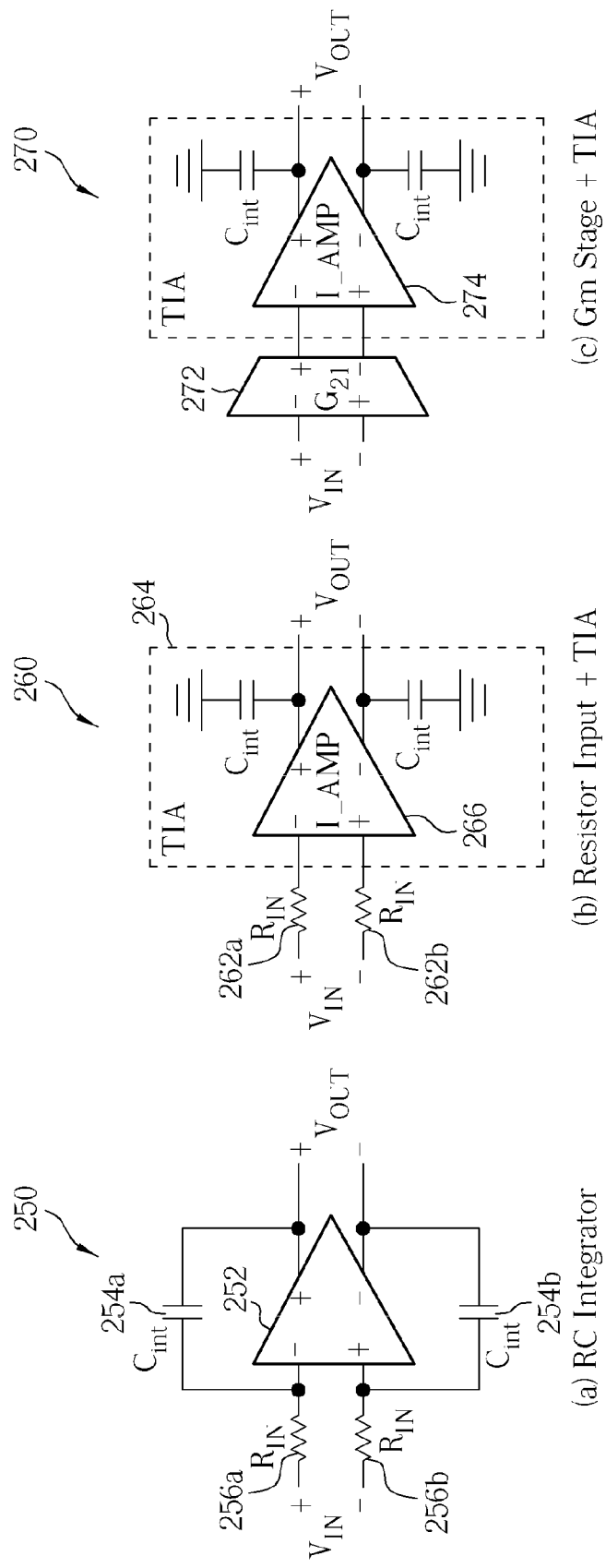
FIGS. 10A to 10C are diagrams of example integrator stages.

The integrator stages of the continuous time converter can be implemented in many different ways, each with various tradeoffs. FIGS. 10A to 10C show examples of integrator stages. FIG. 10A shows an RC integrator 250. Here, an operational amplifier 252 is configured with integrating capacitors ($C_{int}$) 254a, 254b and input resistors ($R_{IN}$) 256a, 256b. The voltage drops across the input resistors 256a, 256b set the input currents that charge the integrating capacitors ($C_{int}$) 254a, 254b. The component values $R_{IN}$ and $C_{int}$ are selected to provide the appropriate gain and the amplifier is designed to meet speed and gain settings that are specified by system performance requirements.

FIG. 10B shows an integrator stage 260 that uses input resistors 262a, 262b and a transimpedance amplifier (TIA) 264. The transimpedance amplifier 264 takes a current input and generates a voltage output. In this case, a current buffer (or current amplifier) 266 provides low input impedance to the input current, as set by $V_{IN}$ and $R_{IN}$, and outputs the same current with a higher output impedance. The impedance set by the load, in this case a capacitor $C_{int}$, is what determines the voltage generated at the output. The current amplifier 266 can also be used to shift the common-mode voltage between the input and output as well as extend the voltage range at the output of the amplifier.

FIG. 11 shows an example implementation of the current buffer 266. Current sources $I_1$ provide biasing for the stage. Input currents $I_{IN+}$ and $I_{IN-}$ feed into the sources of transistors $M_2$ and $M_1$, respectively. Amplifier $A_1$ is configured in an active cascade configuration with transistors $M_2$ and $M_1$ in order to reduce the impedance seen at the source and increase the impedance seen at the drain of the two devices. This benefit is seen within the bandwidth of the amplifier ($A_1$).

Transistors $M_5$ and $M_6$ provide bias currents for the lower part of the amplifier. Transistors $M_3$ and $M_4$ are used along with amplifier $A_2$ in order to implement another active cascade, thereby raising the output impedance seen looking into the sink current sources from the output. Transistors $M_7$ and $M_8$ provide common-mode feedback to stabilize the output voltage.

FIG. 10C shows an example implementation for an integrator stage 270. A transconductance amplifier 272 (labeled Gm) converts the input voltage to a current, which is input to a current buffer (or current amplifier) 274 in order to generate the desired transfer function of the stage. The Gm-stage converts its voltage input into a current output with a nominally linear gain, and provides a relatively high input and output impedance.

Figure 12:
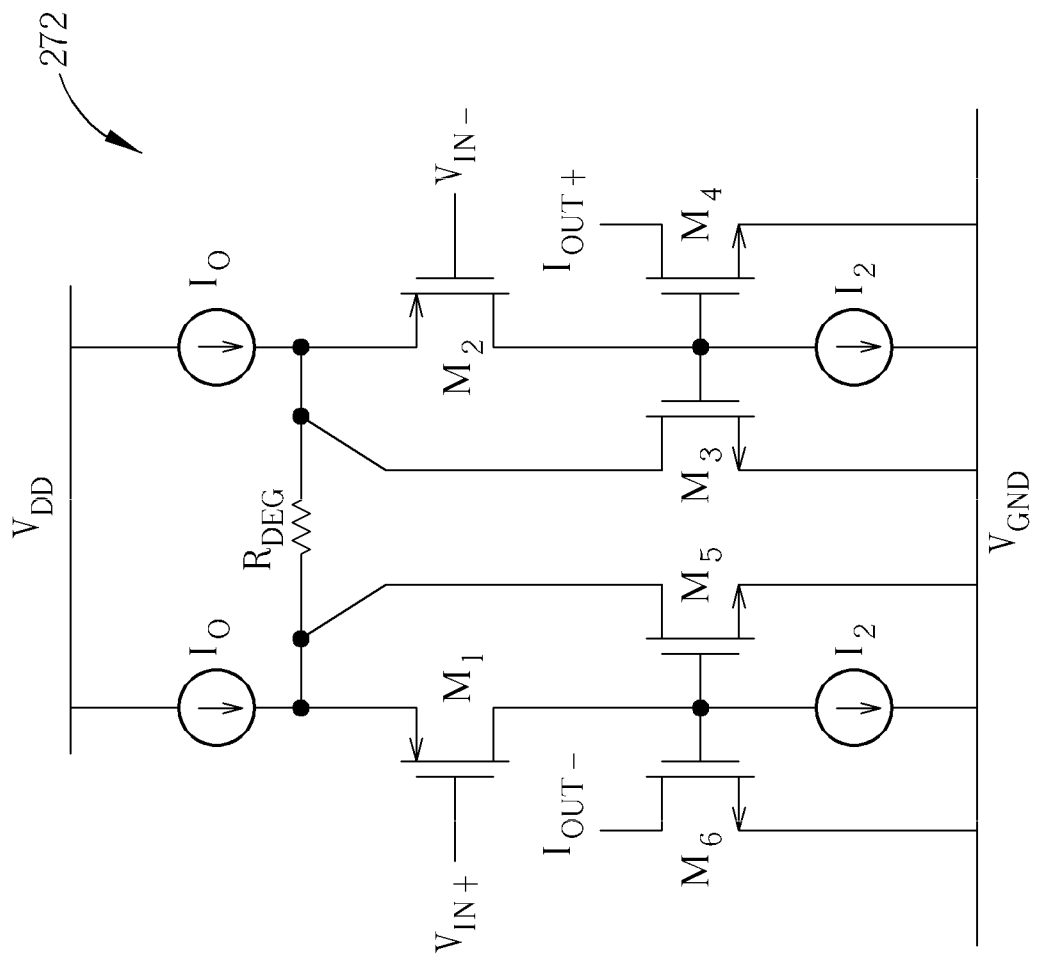
FIG. 12 is a diagram of an example Gm-stage.

FIG. 12 shows an example implementation for the Gm-stage 272. The Gm-stage 272 includes a transistor $M_2$ that is biased as a gain stage, which drives the gate of transistor $M_3$. The drain current of transistor $M_3$ is connected back to the source of transistor $M_2$. The result is that the gate-to-source voltage of transistor $M_2$ is tightly controlled such that the drain current of transistor $M_2$ is equal to current $I_2$. Any change in voltage at $V_{IN-}$ is reflected in the source voltage of transistor $M_2$. Using this configuration, any change in the current across resistor $R_{DEG}$ is accompanied by an equal change in the drain current of transistor $M_3$ (in order for the drain current of transistor $M_2$ to remain constant). The circuit is symmetrical and with transistors $M_1$ and $M_5$ functioning in an identical fashion to transistor $M_2$ and $M_5$, respectively. Because the gate-source voltage of transistors $M_1$ and $M_2$ are kept nearly constant by the feedback loops, any change in the voltage difference between $V_{IN+}$ and $V_{IN-}$ is reflected with a corresponding voltage change across resistor $R_{DEG}$, changing the current proportionately. The change in the current across resistor $R_{DEG}$ is reflected by an equal change in the drain currents of transistors $M_3$ and $M_5$. The differential output current is generated by mirror transistors $M_6$ and $M_4$.

Each of the three implementations of integrator stages 250 (FIG. 10A), 260 (FIG. 10B), and 270 (FIG. 10C) has certain advantages and disadvantages. Determining the best solution for a given integrator is a function of where the stage is used within a converter and the specific requirements that are in place. For example, the RC integrator of FIG. 10A is typically used for the first stage of a converter. Compared to the integrator stages 260 and 270, the integrator stage 250 has less noise, lower offsets, and typically lower distortion. It is easy to add extra inputs to the integrator by using more resistors (no active stages). Disadvantages of the integrator stage 250 can include increased power consumption, coefficient errors, and a right-half-plane (RHP) zero that can reduce the effective output swing. The movement in the summing junction (the input terminals of the amplifier) should be restricted to a specific level in order to achieve a given performance target for the ADC.

The integrator stage 260 shown in FIG. 10B also has the benefit that it is easy to add extra inputs to the integrator by using more resistors (without active stages). The integrator stage 260 typically has a high bandwidth for a given power budget, and it does not suffer from the RHP zero of the integrator stage 250. Disadvantages of the integrator stage 260 include large offset and potential for large distortion due to movements at its input.

The integrator stage 270 of FIG. 10C has the advantage that it is not sensitive to movement at its inputs. The input currents of the current buffer 274 are controlled by the GM-stage 272, so the gain of the stage does not vary as a result of input voltage variations (nor does this cause distortion). The disadvantage of this implementation is reduced input swing and increased power, both due to the use of the Gm stage 272. Additionally, if the Gm-stage 272 is implemented closed loop, it can restrict the bandwidth (speed) of the overall integrator stage 270. If multiple inputs to the integrator stage 270 are required, additional Gm stages will be needed in order to maintain the advantages of this implementation.

Figure 13:
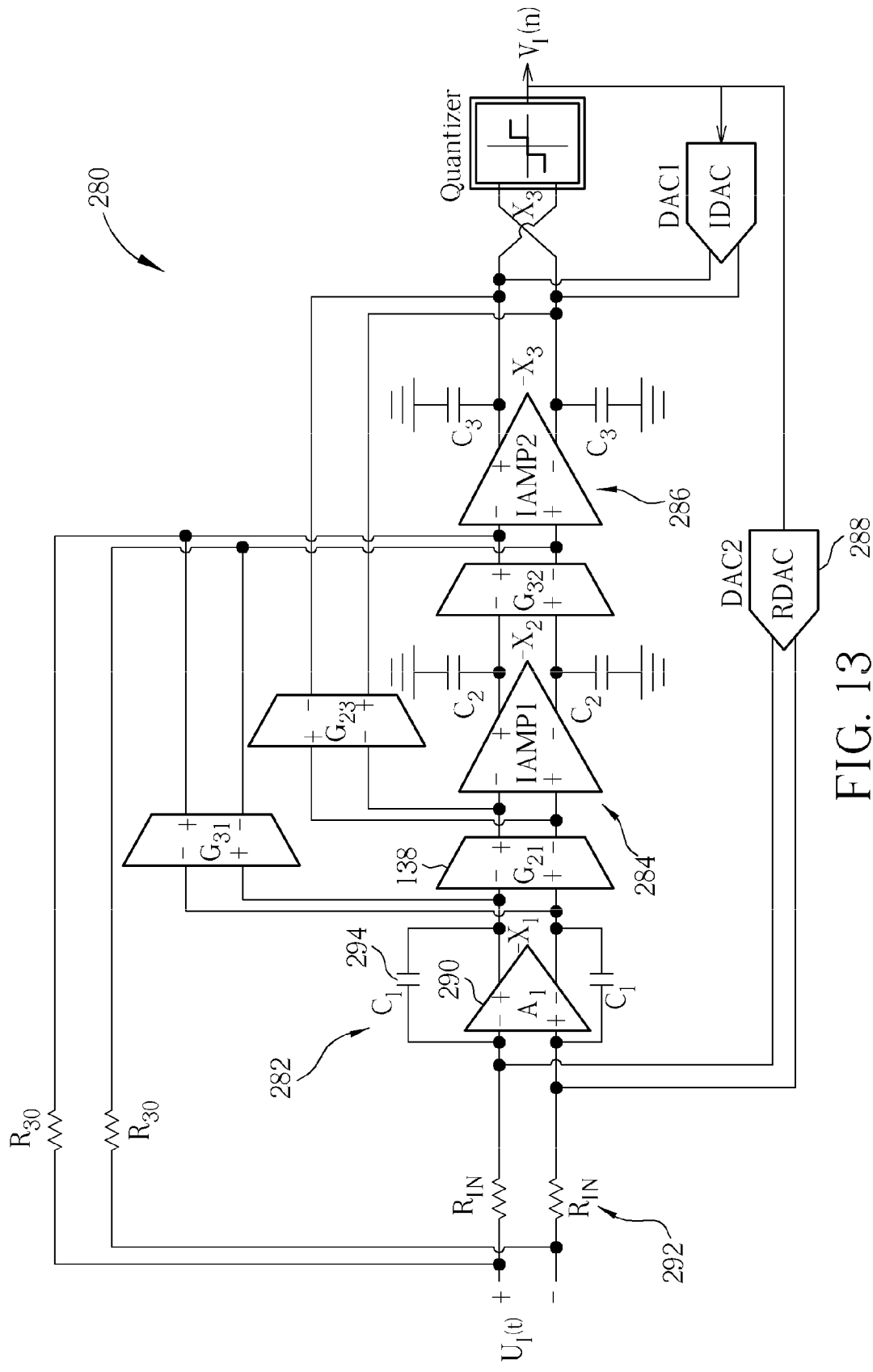
FIG. 13 is a diagram of an example third order continuous-time sigma-delta analog-to-digital converter.

Referring to FIG. 13, an example continuous-time sigma-delta converter 280 includes some of the integrator stages shown in FIGS. 10A to 10C. An RC integrator 282 is used at the input for its low-noise, low-distortion characteristic. The integrator 282 includes an amplifier 290, input resistors 292, and integrating capacitors 294. Second and third integrator stages 284 and 286 are implemented with various combinations of Gm stages, TIAs, and resistive branches. In this example, there is no feedback to the output of the first integrator stage 282. Instead, feed-forward is used around the second integrator stage ($C_{31}$) in order to provide the necessary dynamics for the converter. This has the benefit of removing or reducing the signal content that is observed at the input terminals of the first stage amplifier, thereby lowering distortion. The feed-forward from the input to the third stage integrator is implemented with the $R_{30}$ resistor pair. This is done to adjust the signal transfer function (STF) from the input of the converter to the output. Without this feed-forward path, there may be peaking (a forward-gain greater than unity) at relatively low frequencies.

Figure 14:
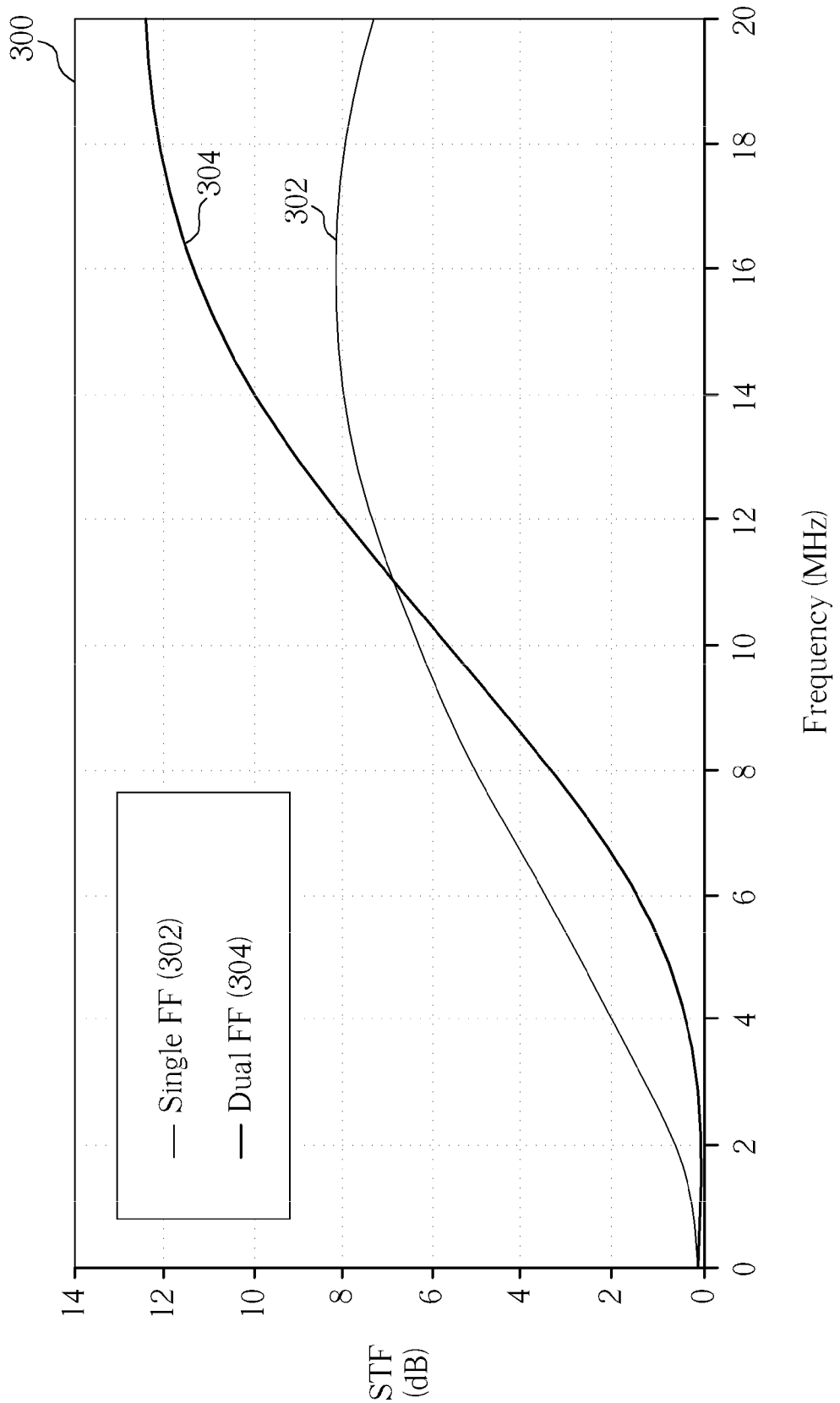
FIG. 14 is a graph of signal transfer functions of converters.

Referring to FIG. 14, a graph 300 shows a comparison of the signal transfer functions a converter that uses a single feed forward path and a converter that uses double feed forward paths. A curve 302 represents the signal transfer function of a converter that uses a single feed forward path. A curve 304 represents the signal transfer function of a converter that uses double feed forward paths. Adding the second feed-forward path from the input increases the frequency at which the STF peaking begins. The additional forward path maintains a relatively flat STF over a wider frequency range, providing a more ideal gain characteristic for a wider frequency range.

To meet given performance targets with the converter, certain specifications are imposed on the analog circuitry of each integrator stage. These specifications determine the speed and power budgets for the overall converter. For example, the first integrator stage 282 of the converter 280 in FIG. 13 includes the resistor $R_1$ and capacitor $C_1$ pairs, and the amplifier $A_1$. The first integrator stage 282 also receives an input from a feedback DAC 288, labeled DAC2. One non-ideality in the first integrator stage 282 is the movement in the input voltage to the amplifier 290.

Figure 15:
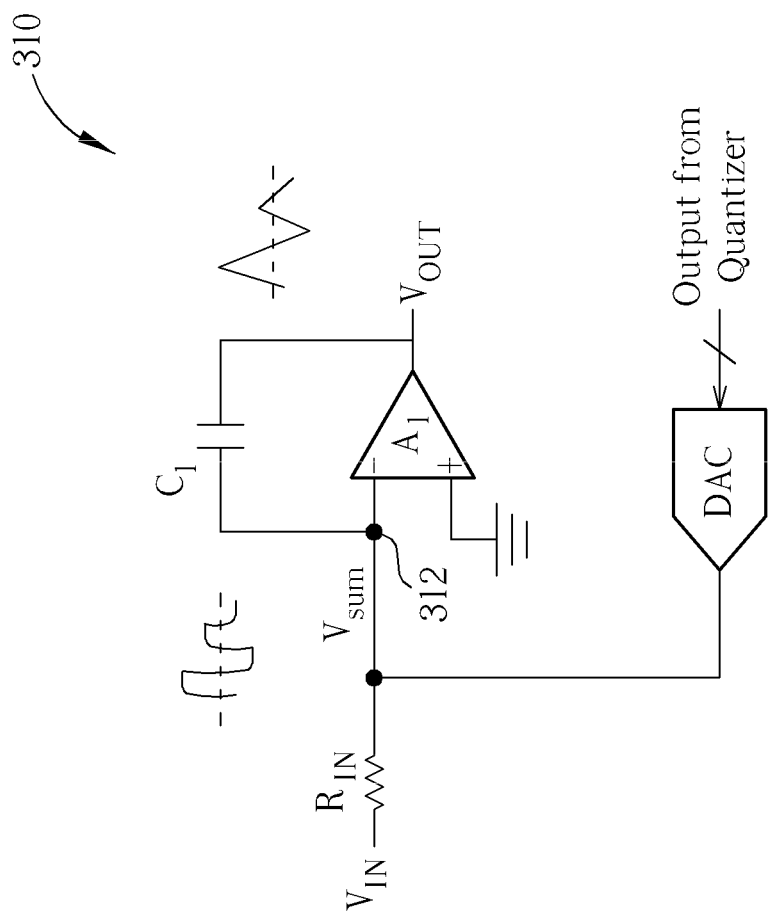
FIG. 15 is a diagram showing the effects of voltage variations at a summing junction of an integrator stage.

The effects of movements in the input voltage to the amplifier 290 is shown in a diagram in FIG. 15, in which a single-ended implementation is illustrated for convenience. Ideally, the charging current to the integrating cap $C_1$ is set by the input current ($V_{IN}/R_{IN}$) less the feedback current from the DAC. For this to occur, the voltage $V_{sum}$ (at a summing junction 312, or the input to the amplifier) needs to be at 0V or some other fixed common-mode voltage. However, due to the finite gain and speed of the amplifier, the voltage ($V_{sum}$) at the summing junction 312 may move in response to the charging current coming into the stage. This can have a negative impact on the performance of the converter in several ways.

For example, the input current through resistor $R_{IN}$ will be a function of both $V_{IN}$ and $V_{sum}$. This can modify the gain of the integrator which varies the dynamics of the converter. Because the amplifier will not have a perfectly linear characteristic as its input voltage moves, movement in the summing junction 312 may also cause distortion.

Movement in the summing junction 312 may appear at the output of the stage, thereby reducing the available output swing of the amplifier. Because the output voltage $V_{OUT}$ is a summation of the capacitor voltage $V_{C1}$ and the amplifier's input voltage $V_{sum}$, variation in the latter may consume a portion of the finite output range of the amplifier, leaving less available swing for the signal. Since the movement of the summing junction 312 is added to the output signal, this may result in an unintended (and unwanted) right-half-plane zero (RHPZ) in the transfer function of the stage.

The movement of the summing junction 312 needs to be supported by the output range of the DAC. Shifting the output voltage of the DAC may cause distortion in the feedback signal. Additionally, the DAC may be required to operate at a lower output voltage, which may consume valuable voltage headroom that may otherwise be used in the DAC for reducing noise and/or improving switching characteristics.

The following describes the factors that affect the characteristics of the charging current to the stage. The output of the feedback DAC includes out of band frequency content from the shaped quantization noise. This is shown in FIG. 9. The high frequency content from the DAC can be a large contributor to the movement of the summing junction 312. A second major contributor is the higher frequency content seen at the input to the converter $V_{IN}$. At relatively low input signal frequencies, the feedback DAC cancels most of the current through $R_{IN}$ and there will be little charging current to $C_1$. As a result, there is little movement at the summing junction 312 in this frequency range. However, as the input frequency is increased, the feedback path that loops back through the DAC will eventually be too slow to respond to the input signal. As a result, charging currents will increase and $V_{sum}$ will move accordingly.

In some applications, significant out-of-band signal content (above baseband frequency) may not be present. Examples of such applications include an audio converter or any other system in which signal bandwidths may be limited before reaching the converter. However, this is not always the case. In the case of a continuous-time converter used in the baseband the receive chain, it is possible that there will be relatively large high frequency signals that represent either neighboring channels or unrelated signals that are completely out of band. While filters can be placed before the continuous time converter, gain settings may be such that the out-of-band signals are still significant by the time they reach the converter.

Figure 16:
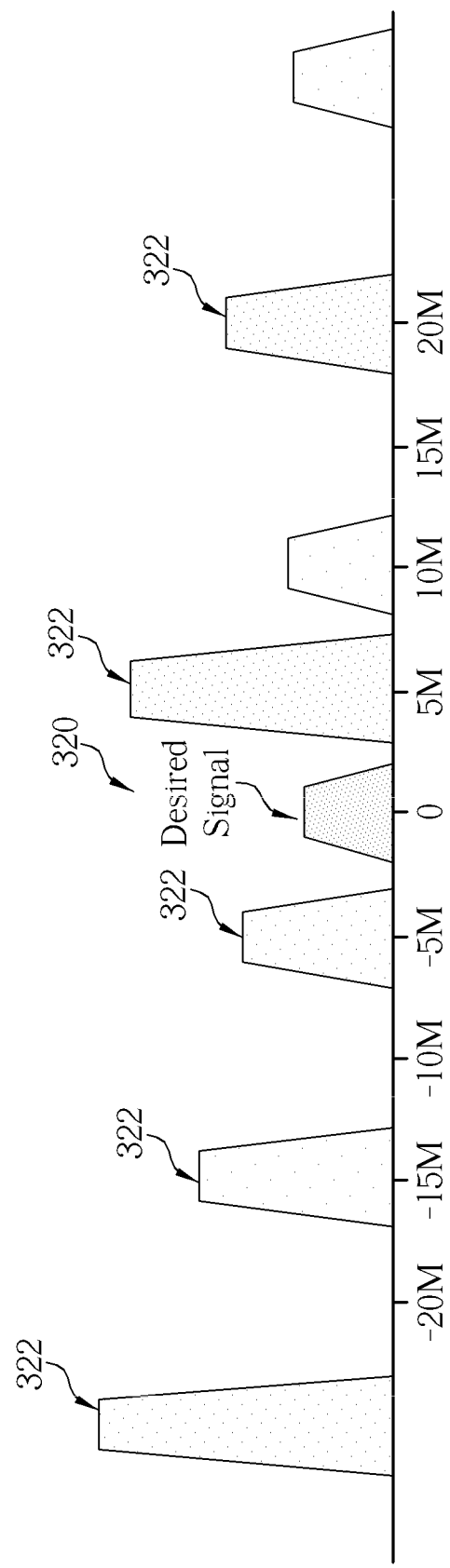
FIG. 16 shows an example spectrum of input signals to an analog-to-digital converter.

FIG. 16 shows an example spectrum of input signals to an analog-to-digital converter. The input signals include the baseband signal 320 and out-of-band signals 322 that are present at large frequency offsets relative to baseband. The higher frequency signals 322 seen at the input of the converter can be the source of increased movement in the summing junction 312 (amplifier input) as illustrated in FIG. 15.

Referring back to FIG. 13, another example of where non-idealities can affect converter performance is in the outer feed-forward path implemented with the $R_{30}$ resistor pair. This feed-forward path is used to keep the STF flatter in the baseband frequency range of the converter. In this example, resistive feed-forward is used in order to save power and die area, versus using an active Gm stage. However, this approach has some tradeoffs. First, the voltage at the inputs to the IAMP2 (the current buffer in the third integrator stage) may move around as the input currents vary. This is the same problem for the inputs to the first amplifier. If the current buffer is implemented as shown FIG. 11, the impedance seen at the input may rise for frequencies above the bandwidth of the amplifier forming the active cascade, making the effect worse for higher (out of band) frequencies. The gain in front of the third stage reduces the effect of this non-ideality on the performance of the converter. However, the mechanism still places requirements on the current buffer in order to process the input currents while meeting the requirements set by the converter.

The resistive feed-forward path is sensitive to common-mode voltage differences between the inputs of the first and third stages. In such a configuration, the input common-mode voltage may differ from that of the third stage. The bias voltage may be different for the input common-mode voltage and that of the third stage. The bias voltage may also vary due to varying conditions on the channel in front of the ADC. Ideally, the third stage amplifier has perfect common-mode rejection and is unaffected by the common-mode differential. However, in actual implementation the common-mode differential may have a negative impact on performance. First, mismatches both in the resistors ($R_{30}$) and within the amplifier may cause some of the common-mode variations to be processed as a differential signal. The may result in increased noise and/or distortion as seen at the output of the third stage. Second, variations in the input common-mode current level may shift the output common-mode voltage of the third stage amplifier. This may result in a reduced differential voltage swing being available at the output of the stage.

The effects of the non-idealities described above can be managed by carefully specifying the performance requirements of each of the sub-blocks and then designing accordingly. In general, issues associated with movements at the summing junction result in enhanced speed requirements for the amplifier stages, thereby increasing the power consumption of the converter. Use of additional Gm-stages or other buffering may also be used to combat the problems with movement of the inputs to the amplifiers. However, this also has the disadvantage of increasing the power and adding die area. The issue of handling different common-modes can be handled with either Gm (or buffer) stages and/or by increasing the complexity/currents within the integrator stages.

Comparing the converters 100 (FIG. 1), 200 (FIG. 3), 210 (FIG. 4), 220 (FIG. 5), and 230 (FIG. 6) with the converter 280 of FIG. 13, use of passive filters (e.g., low-pass filters 126, 222 and band-pass filters 158, 212) reduces the amount of high frequency components in the input signal U(t) that need to be processed by the integrator stages. The use of passive filters (e.g., band-pass filters 158, 212 and high-pass filters 202, 232) reduces the variations in the common mode voltage at the inputs of the amplifiers or buffers of the integrator stages. This results in less power required for the converter, and/or reduces the die area needed for the converter.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

For example, a low-pass filter (similar to the low-pass filter 126), a band-pass filter (similar to the band-pass filter 158), or a high-pass filter (similar to the high-pass filter 202) can be used in the feedback path 176. A continuous-time sigma-delta analog-to-digital converter can include more than four integrator stages. In each of the examples in FIGS. 1 and 3 to 6, a dynamic element matching block can be coupled in series with the outer feedback digital-to-analog converter.

Accordingly, other implementations are within the scope of the following claims.

What is claimed is:

1. An apparatus comprising:
a continuous-time sigma-delta analog-to-digital converter comprising:
a first integrator stage to integrate a difference between a first differential signal derived from a differential analog input signal and a second differential signal derived from a quantized output signal, the first integrator stage having a differential operational amplifier, a first input resistor, a second input resistor, a third input resistor, a fourth input resistor, and a first pair of integrating capacitors,
in which the differential analog input signal is received by a first input node and a second input node of the converter, the first and third input resistors are coupled in series between a first input of the operational amplifier and the first input node, the second and fourth input resistors are coupled in series between a second input of the operational amplifier and the second input node, the first input resistor is coupled to the third input resistor at a third node, the second input resistor is coupled to the fourth input resistor at a fourth node;
a quantizer to quantize a third signal derived at least in part from an output of the first integrator stage to generate the quantized output signal; and
a low pass filter to reduce high frequency components of the differential analog input signal provided to the first and second inputs of the operational amplifier, the low pass filter having a cutoff frequency selected to reduce voltage variations at the first and second inputs of the operational amplifier, the low pass filter comprising the first, second, third, and fourth input resistors and a filter capacitor coupled between the third and fourth nodes.

2. The apparatus of claim 1 in which the filter capacitor provides a low impedance path for high frequency components in the differential input signal.

3. An apparatus comprising:
a continuous-time sigma-delta analog-to-digital converter comprising:
a first integrator stage to integrate a difference between a first differential signal derived from a differential analog input signal and a second differential signal derived from a quantized output signal, the first integrator stage having a differential operational amplifier, a first input resistor, a second input resistor, and a first pair of integrating capacitors,
in which the differential analog input signal is received at a first input node and a second input node of the converter, the first input resistor is connected in series between a first input of the operational amplifier and the first input node, the second input resistor is connected in series between a second input of the operational amplifier and the second input node;
a quantizer to quantize a third signal derived at least in part from an output of the first integrator stage to generate the quantized output signal; and
a high pass filter to remove DC components of the differential analog input signal provided to the first and second inputs of the operational amplifier, the high pass filter comprising the first and second input resistors, a first filter capacitor coupled in series between the first input resistor and the first input node, and a second filter capacitor coupled in series between the second input resistor and the second input node.

4. The apparatus of claim 3 in which the first and second capacitors block low frequency components in the first and second input signals from passing to the differential amplifier.

5. An apparatus comprising:
a continuous-time sigma-delta analog-to-digital converter comprising:
a first integrator stage to integrate a difference between a first signal derived from a differential analog input signal and a second differential signal derived from a quantized output signal, the first integrator stage having a differential operational amplifier, a first input resistor, a second input resistor, a third input resistor, a fourth input resistor, and a first pair of integrating capacitors,
in which the differential analog input signal is received at a first input node and a second input node of the converter, the first and third input resistors are connected in series between a first input of the operational amplifier and the first input node, the second and fourth input resistors are connected in series between a second input of the operational amplifier and the second input node, the first input resistor is connected to the third input resistor at a third node, and the second input resistor is connected to the fourth input resistor at a fourth node;
a quantizer to quantize a third signal derived at least in part from an output of the first integrator stage to generate the quantized output signal; and
a band pass filter to reduce frequency components of the differential analog input signal outside of a pass band provided to the first and second inputs of the operational amplifier, the band pass filter having an upper cutoff frequency selected to reduce voltage variations at the first and second inputs of the operational amplifier, the band pass filter comprising the first, second, third, and fourth input resistors, a first filter capacitor coupled between the third and fourth nodes, a second filter capacitor coupled in series between the third input resistor and the first input node, and a third filter capacitor coupled in series between the fourth input resistor and the second input node.

6. An apparatus comprising:
a continuous-time third order sigma-delta analog-to-digital converter comprising:
an input terminal to receive an analog input signal;
a first integrator stage to integrate a difference between a first signal derived from the analog input signal and a second signal derived from a quantized output signal;
a second integrator stage to integrate a third signal derived at least in part from an output of the first integrator stage;
a third integrator stage to integrate a sum of a fourth signal derived from a feed-forward signal and a fifth signal derived at least in part from an output of the second integrator stage, the third integrator stage comprising an amplifier;
a feed-forward path to provide a signal path for the feed-forward signal from the input terminal to the third integrator stage, the feed-forward path comprising a filter to reduce high frequency components of the feed-forward signal provided to the third integrator stage, the filter having a cutoff frequency selected to reduce voltage variations at an input of the amplifier of the third integrator stage; and
a quantizer to quantize a sixth signal derived at least in part from an output of the third integrator stage to generate the quantized output signal.

7. The apparatus of claim 6 in which the filter comprises a low pass filter.

8. The apparatus of claim 7 in which the input terminal comprises a differential input terminal having a first input node and a second input node, the amplifier of the third integrator stage comprises a differential amplifier,
the low pass filter comprises a first resistor, a second resistor, a third resistor, a fourth resistor, and a filter capacitor,
the first and third resistors are coupled in series between the first input node and a first input of the differential amplifier, the second and fourth resistors are coupled in series between the second input node and a second input of the differential amplifier, the first resistor is coupled to the third resistor at a third node, the second resistor is coupled to the fourth resistor at a fourth node, and
the filter capacitor is coupled between the third and fourth nodes.

9. The apparatus of claim 6 in which the filter comprises a band pass filter, the band pass filter also reducing low frequency components of the feed-forward signal provided to the third integrator stage.

10. The apparatus of claim 9 in which the input terminal comprises a differential input terminal having a first input node and a second input node, the amplifier of the third integrator stage comprises a differential amplifier,
the band pass filter comprises a first resistor, a second resistor, a third resistor, a fourth resistor, a first filter capacitor, a second filter capacitor, and a third filter capacitor,
the first and third resistors are coupled in series between the first input node and a first input of the differential amplifier, the second and fourth resistors are coupled in series between the second input node and a second input of the differential amplifier, the first resistor is coupled to the third resistor at a third node, the second resistor is coupled to the fourth resistor at a fourth node,
the first filter capacitor is coupled between the third and fourth nodes, the second filter capacitor is coupled in series between the third resistor and the first input node, and the third filter capacitor is coupled in series between the fourth resistor and the second input node.

11. The apparatus of claim 6 in which the filter comprises a high pass filter to reduce low frequency components of the feed-forward signal provided to the third integrator stage.

12. The apparatus of claim 11 in which the input terminal comprises a differential input terminal having a first input node and a second input node, the amplifier of the third integrator stage comprises a differential amplifier,
the high pass filter comprises a first resistor, a second resistor, a first filter capacitor, and a second filter capacitor,
the first resistor and the first filter capacitor are coupled in series between the first input node and a first input of the differential amplifier, and the second resistor and the second filter capacitor are coupled in series between the second input node and a second input of the differential amplifier.

13. The apparatus of claim 6 in which the amplifier in the third integrator stage comprises a transimpedance amplifier that receives a current input and provides a voltage output.

14. An apparatus comprising:
a continuous-time third order sigma-delta analog-to-digital converter comprising:
a first integrator stage to integrate a difference between a first signal derived from an analog input signal and a second signal derived from a quantized output signal;
a second integrator stage to integrate a sum of a third signal derived from an output of the first integrator stage and a fourth signal derived from a feed-back signal, the second integrator stage comprising an amplifier;
a third integrator stage to integrate a fifth signal derived from an output of the second integrator stage;
a feed-back path to provide a signal path for the feed-back signal from an output of the third integrator stage to an input of the second integrator stage, the feed-back path comprising a filter to reduce selected frequency components of the feed-back signal provided to the second integrator stage, the filter having a cutoff frequency selected to reduce voltage variations at an input of the amplifier of the second integrator stage; and
a quantizer to quantize a sixth signal derived at least in part from the output of the third integrator stage to generate the quantized output signal.

15. The apparatus of claim 14 in which the filter comprises a low pass filter.

16. The apparatus of claim 15 in which the input signal comprises a differential input signal, the amplifier of the second integrator stage comprises a differential amplifier, the amplifier of the third integrator stage comprises a differential amplifier,
the low pass filter comprises a first resistor, a second resistor, a third resistor, a fourth resistor, and a filter capacitor,
the first and third resistors are coupled in series between a first input of the amplifier of the second integrator stage and a first output of the amplifier of the third integrator stage, the second and fourth resistors are coupled in series between a second input of the amplifier of the second integrator stage and a second output of the amplifier of the third integrator stage, the first resistor is coupled to the third resistor at a first node, the second resistor is coupled to the fourth resistor at a second node, and
the filter capacitor is coupled between the first and second nodes.

17. The apparatus of claim 14 in which the filter comprises a band pass filter, the band pass filter reducing some low and high frequency components of the feed-back signal provided to the second integrator stage.

18. The apparatus of claim 17 in which the input signal comprises a differential input signal, the amplifier of the second integrator stage comprises a differential amplifier, the amplifier of the third integrator stage comprises a differential amplifier,
the band pass filter comprises a first resistor, a second resistor, a third resistor, a fourth resistor, a first filter capacitor, a second filter capacitor, and a third filter capacitor,
the first and third resistors are coupled in series between a first input of the differential amplifier of the second integrator stage and a first output of the differential amplifier of the third integrator stage, the second and fourth resistors are coupled in series between a second input of the differential amplifier of the second integrator stage and a second output of the differential amplifier of the third integrator stage, the first resistor is coupled to the third resistor at a first node, the second resistor is coupled to the fourth resistor at a second node, the first filter capacitor is coupled between the first and second nodes, the second filter capacitor is coupled in series between the third resistor and a first input of the differential amplifier of the second integrator stage, and the third filter capacitor is coupled in series between the fourth resistor and a second input of the differential amplifier of the second integrator stage.

19. The apparatus of claim 14 in which the filter comprises a high pass filter.

20. The apparatus of claim 19 in which the input signal comprises a differential input signal, the amplifier of the second integrator stage comprises a differential amplifier, the amplifier of the third integrator stage comprises a differential amplifier, the high pass filter comprises a first resistor, a second resistor, a first filter capacitor, and a second filter capacitor, the first resistor and the first filter capacitor are coupled in series between a first output of the differential amplifier of the third integrator stage and a first input of the differential amplifier of the second integrator stage, and the second resistor and the second filter capacitor are coupled in series between a second output of the differential amplifier of the third integrator stage and a second input of the differential amplifier of the second integrator stage.

21. An apparatus comprising:

a continuous-time sigma-delta analog-to-digital converter comprising:

a first integrator stage to integrate a difference between a first signal derived from the analog input signal and a second signal derived from a quantized output signal, the first integrator stage comprising an amplifier;

a quantizer to quantize a third signal derived at least in part from an output of the first integrator stage to generate the quantized output signal;

a resistor digital-to-analog converter to convert the quantized output signal to the second signal, the resistor digital-to-analog converter comprising switches and resistors; and at least one capacitor that in combination with the resistors form a low-pass filter to reduce high frequency components in the second signal, the low-pass filter having a cutoff frequency selected to reduce voltage variations at an input of the amplifier of the first integrator stage.

* * * * *

UNITED STATES PATENT AND TRADEMARK OFFICE
CERTIFICATE OF CORRECTION

PATENT NO. : 8,502,719 B2
APPLICATION NO. : 13/354333
DATED : August 6, 2013
INVENTOR(S) : Michael A. Ashburn Jr. et al.

It is certified that error appears in the above-identified patent and that said Letters Patent is hereby corrected as shown below:

Title Page, item (75), correct the name of the first inventor from "Michael A. Ashburn, JR." to --Michael A. Ashburn JR.--.

Signed and Sealed this
Fifteenth Day of October, 2013

Teresa Stanek Rea
*Deputy Director of the United States Patent and Trademark Office*